(12) United States Patent
Kim et al.

(10) Patent No.: US 8,742,493 B2
(45) Date of Patent: Jun. 3, 2014

(54) SEMICONDUCTOR DEVICES HAVING VERTICAL CHANNEL TRANSISTORS AND METHODS FOR FABRICATING THE SAME

(75) Inventors: Dae-Ik Kim, Hwaseong-si (KR);
Hyeong-Sun Hong, Seongnam-si (KR);
Yoo-Sang Hwang, Suwon-Si (KR);
Hyun-Woo Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

(21) Appl. No.: 13/285,263

(22) Filed: Oct. 31, 2011

(65) Prior Publication Data

US 2012/0119286 A1    May 17, 2012

(30) Foreign Application Priority Data

Nov. 11, 2010   (KR) ..................... 10-2010-0112260

(51) Int. Cl.
*H01L 27/108*    (2006.01)
(52) U.S. Cl.
USPC ..... 257/330; 257/302; 257/329; 257/E21.676

(58) Field of Classification Search
USPC .......................... 257/302, 329, 330, E21.676
See application file for complete search history.

(56) References Cited

U.S. PATENT DOCUMENTS

| | | | |
|---|---|---|---|
| 5,656,842 A * | 8/1997 | Iwamatsu et al. | 257/329 |
| 6,853,023 B2 * | 2/2005 | Goebel et al. | 257/301 |
| 7,387,931 B2 | 6/2008 | Seo et al. | |

FOREIGN PATENT DOCUMENTS

| | | |
|---|---|---|
| KR | 10-0688576 B1 | 2/2007 |
| KR | 10-0910228 B1 | 7/2009 |
| KR | 10-2009-011-0680 A | 10/2009 |

* cited by examiner

*Primary Examiner* — Amar Movva
(74) *Attorney, Agent, or Firm* — Volentine & Whitt, PLLC

(57) ABSTRACT

A semiconductor device has a plurality of vertical channels extending upright on a substrate, a plurality of bit lines extending among the vertical channels, a plurality of word lines which include a plurality of gates disposed adjacent first sides of the vertical channels, respectively, and a plurality of conductive elements disposed adjacent second sides of the vertical channels opposite the first sides. The conductive elements can provide a path to the substrate for charge carriers which have accumulated in the associated vertical channel to thereby mitigate a so-called floating effect.

12 Claims, 33 Drawing Sheets

US 8,742,493 B2

SEMICONDUCTOR DEVICES HAVING VERTICAL CHANNEL TRANSISTORS AND METHODS FOR FABRICATING THE SAME

PRIORITY STATEMENT

This U.S. non-provisional patent application claims priority under 35 U.S.C. §119 of Korean Patent Application No. 10-2010-0112260, filed on Nov. 11, 2010, the entire contents of which are hereby incorporated by reference.

BACKGROUND

The inventive concept relates to semiconductor devices. More particularly, the inventive concept relates to a semiconductor device having a vertical channel transistor and to a method of fabricating the same.

Transistors, bit lines, and the like, of semiconductor devices, are formed using various manufacturing techniques. According to one of these techniques, the channel of a Metal Oxide Semiconductor Field Effect Transistor (MOSFET) is formed so as to be horizontal, i.e., substantially parallel to the plane of the substrate used in the forming of the transistor. However, it is becoming more and more difficult to use these techniques to fabricate transistors, bit lines and the like which meet the smaller design rules demanded of today's semiconductor devices. Therefore, manufacturing techniques are constantly being developed with the aim of improving the degree of integration, operating speed, and yield of semiconductor devices. A design that has been proposed for offering an improvement over typical transistors having horizontal channel channels, in terms of their ability to be densely integrated, their resistance, and current driving ability, etc., is that of a transistor having a vertical channel

SUMMARY

According to one aspect of the inventive concept, there is provided a method of fabricating a semiconductor device, which includes forming a plurality of vertical channels extending upright on a base of the device, forming a plurality of bit lines, extending longitudinally in a first direction, among the vertical channels, forming a plurality of word lines having vertical gates extending upright alongside first sides of the vertical channels, respectively, and each having a linear section extending longitudinally in a second direction crossing the first direction, and forming a conductor comprising a plurality of conductive elements disposed adjacent second sides of the vertical channels, respectively, and a conductive line connecting the plurality of conductive elements, wherein the first and second sides each vertical channel are opposite sides of the vertical channel.

According to another aspect of the inventive concept, there is provided a semiconductor device, comprising a plurality of active pillars disposed upright on a base so as to each have first and second opposite sides, a plurality of gates facing the first sides of the vertical channels of the active pillars, respectively, conductive lines extending from the gates, respectively, in a first direction such that each of the gates and the conductive line extending therefrom constitute a word line, a plurality of bit lines extending in a second direction crossing the first direction, and a conductor comprising a plurality of conductive elements facing the second sides of the active pillars, respectively, and an extension line connecting the conductive elements, wherein each of the active pillars is interposed between one of the conductive elements and one of the gates, each of the active pillars has an upper junction at an upper part thereof, a lower junction at a lower part thereof, and a vertical channel located between the upper and lower junctions wherein each of the gates, and the vertical channel and the junctions of the active pillar faced by the gate constitute a field effect transistor.

According to another aspect of the inventive concept, there is provided a semiconductor device comprising: a substrate comprising a base, and an active pillar extending upright on the base, a gate disposed adjacent a first side of the active pillar, and a conductive element facing a second side of the active pillar opposite the first side, wherein the active pillar has first and second opposite sides, upper and lower regions of the active pillar of one conductivity type, and an intermediate region of the other conductivity type constituting a vertical channel, and the vertical channel is interposed between the conductive element and the gate.

DETAILED DESCRIPTION OF THE EMBODIMENTS

Figure 1A:
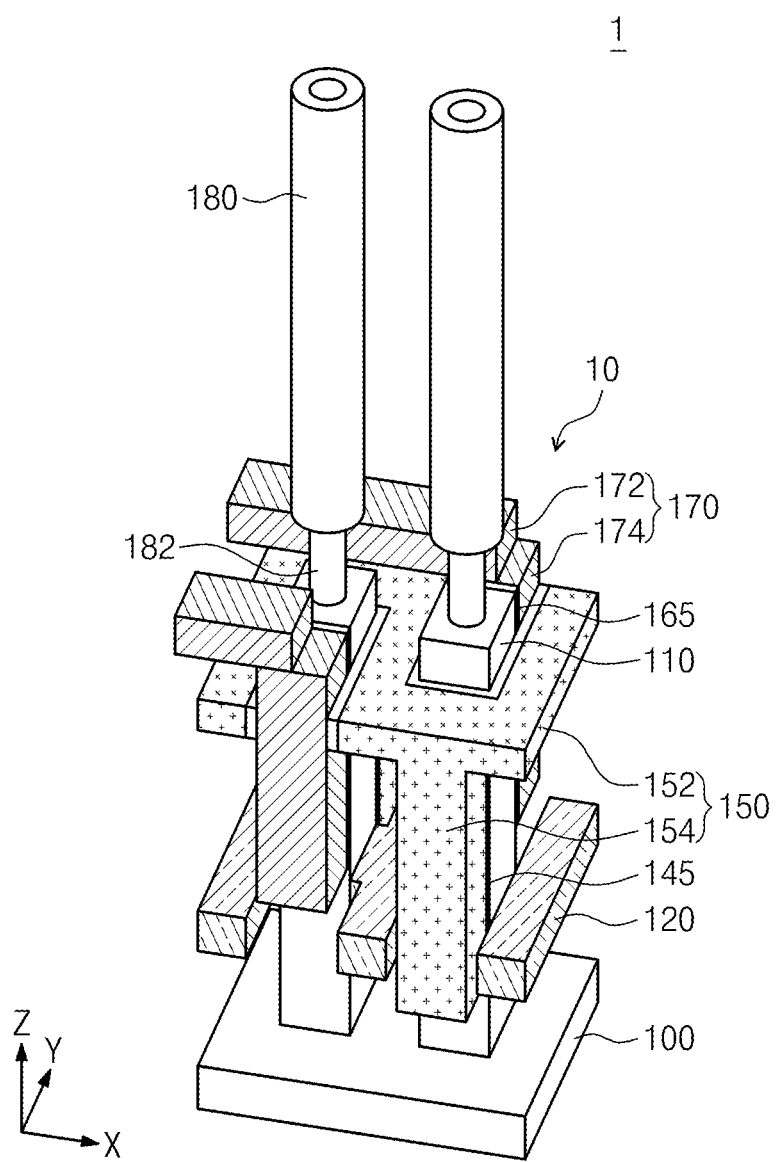
FIG. 1A is a perspective view of one embodiment of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "extending" will generally refer to the longitudinal direction of a particular element, i.e., will indicate the longest dimension of that element. The term "connected" often refers to elements being electrically connected. Also, the term "substrate" may be used to refer to what becomes the generally plate-like base of a substrate that is originally block-like before it is processed.

Referring to FIG. 1A, one embodiment of a semiconductor device 1 according to the inventive concept includes a vertical channel transistor 10. In this embodiment, the semiconductor device 1 is used as a memory device. For instance, the semiconductor device 1 is a Dynamic Random Access Memory (DRAM) including a memory element electrically connected to the vertical channel transistor 10. In one example of this embodiment, the memory element is a capacitor 180 of the type having a dielectric insulator, and the capacitor 180 is electrically connected to the vertical channel transistor 10 by a contact plug 182. The charge accumulated in the capacitor 180, which represents the data stored by the capacitor, can be changed by the (switching of the) vertical channel transistor 10. Other examples of the memory element that may be employed instead of the capacitor 180 include a ferroelectric capacitor, a Magnetic Tunnel Junction (MTJ), and a variable resistor.

The vertical channel transistor 10, of this embodiment, includes a word line 170 and a bit line 120 which cross each other at right angles over a semiconductor substrate 100, and an active pillar 110 crossing each of the word line 170 and the bit line 120 at a right angle. For instance, the word line 170 extends longitudinally in a first horizontal direction (X-direction) over the substrate 100, and the bit line 120 extends longitudinally in a second horizontal direction (Y-direction) between the substrate 100 and the word line 170. The word line 170 may include a vertical gate 174 of a vertical pillar type which faces one side of the active pillar 110, and an extension 172 extending linearly in an X-direction which contacts an upper surface of the vertical gate 174. A gate dielectric layer 165 is interposed between the vertical gate 174 and the active pillar 110.

The active pillar 110 is oriented vertically (extends longitudinally in the Z-direction) on the semiconductor substrate 100. The cross section of the active pillar 110 may have any shape such as that of a circle, oval, or polygon. In the illustrated example of this embodiment, the cross section of the active pillar 110 has the shape of a quadrilateral.

Although only individual elements, such as the vertical gate 174, may have been mentioned above, practically speaking, the semiconductor device 1 has an array of such elements (the array of vertical gates 174 being best shown in FIG. 1C, for example) and therefore, when only an individual element is described, it will be understood that such a description is intended to apply to each of several of the same elements that may be employed in an actual device.

In this embodiment, gates 174 which are aligned in the X-direction are contacted by a respective extension 172 thereby forming a common word line 170. Each bit line 120 is directly connected to every other one of the active pillars 110 which constitute a respective row of all pillars aligned in the Y-direction.

The active pillars 110 and bit lines 120 will be described in more detail referring to FIG. 1B. For the sake of convenience, a "row" will be used to refer to an alignment of elements in the Y-direction, and a "column" will refer to an alignment of elements in the X-direction. In this embodiment, the active pillars 110 are arrayed in rows and columns, i.e., are arranged in a matrix, on the semiconductor substrate 100, and the bit lines 120 are disposed among the active pillars 110. The active pillar 110 has a lower junction 102 at a lower part thereof, an upper junction 112 at an upper part thereof, and a vertical channel 114 spanning the lower junction 102 and the upper junction 112. A bit line 120 contacts the lower junction 102, and a contact plug 182 (refer back to FIG. 1A) contacts the upper junction 112. The width W of the bit line 120 varies at regular intervals in the Y-direction so that the bit line 120 may be connected to select ones of the active pillars 110 which are aligned in the Y-direction (e.g., to every other pillar 110 as mentioned above). More specifically, the bit line 120 has a relatively narrow extension part 123 and wider expansion parts 121 at opposite ends of each extension part in the Y-direction. Also, the expansion parts 121 may have a height greater than that of the extension part 123.

Figure 1B:
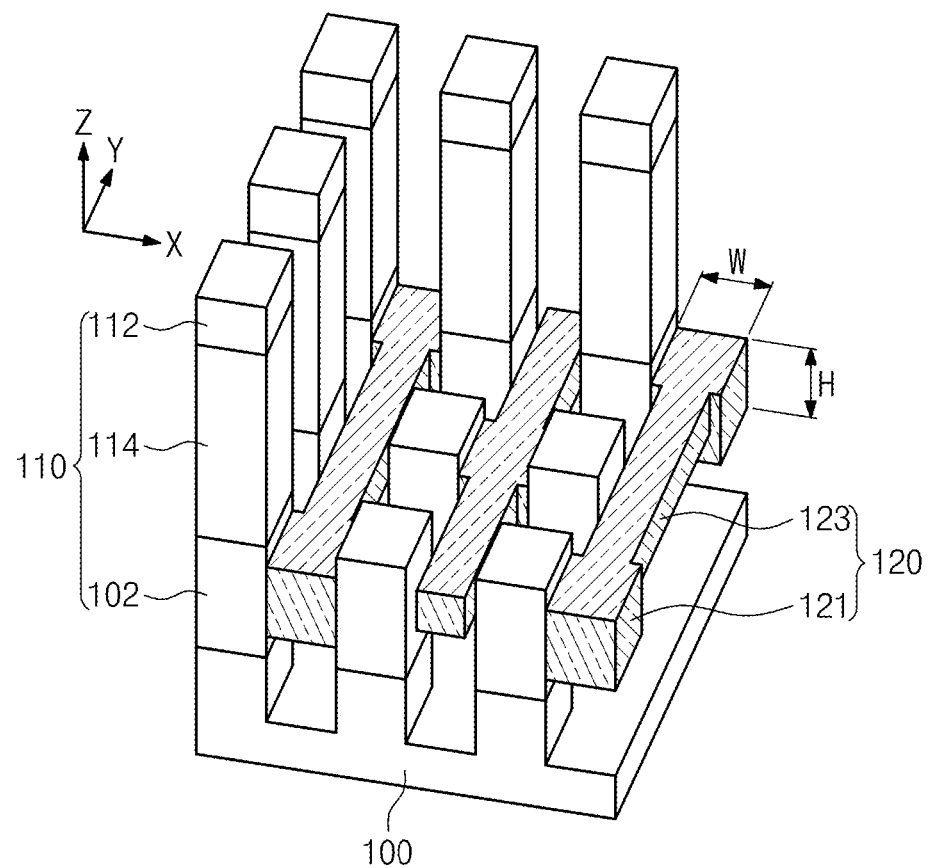
FIG. 1B is a cut-away perspective view of the semiconductor device of FIG. 1A.

Furthermore, as shown in FIG. 1B, the expansion parts 121 of each odd-numbered bit line 120, in the column, may be directly connected to the odd-numbered (or even-numbered) active pillars 110 in a row of the active pillars 110. In this case, the expansion parts 121 of each even-numbered bit line 120, in the column, are directly connected to the even-numbered (or odd-numbered) active pillars 110 in a row of the active pillars 110. In addition, each expansion part 121 is connected to the active pillars 110 that are adjacent one another in a column of the active pillars 110.

Referring back to FIG. 1A, the vertical channel transistor 10 of this embodiment also includes a back-gate line 150 (conductor). The back-gate line 150 has a back-gate 154 (conductive element) facing the side of the active pillar 110 opposite that faced by the vertical gate 174, and an extension 152 disposed directly on the back-gate 154. More specifically, the back-gate 154 has the form of a pillar (vertically oriented so as to extend longitudinally in the Z-direction) adjacent the vertical channel 114. A back-gate dielectric layer 145 is interposed between the back-gate 154 and the active pillar 110. Thus, the side of the active pillar 110 facing the back-gate 154 can be used as a channel of the vertical transistor 10.

Figure 1C:
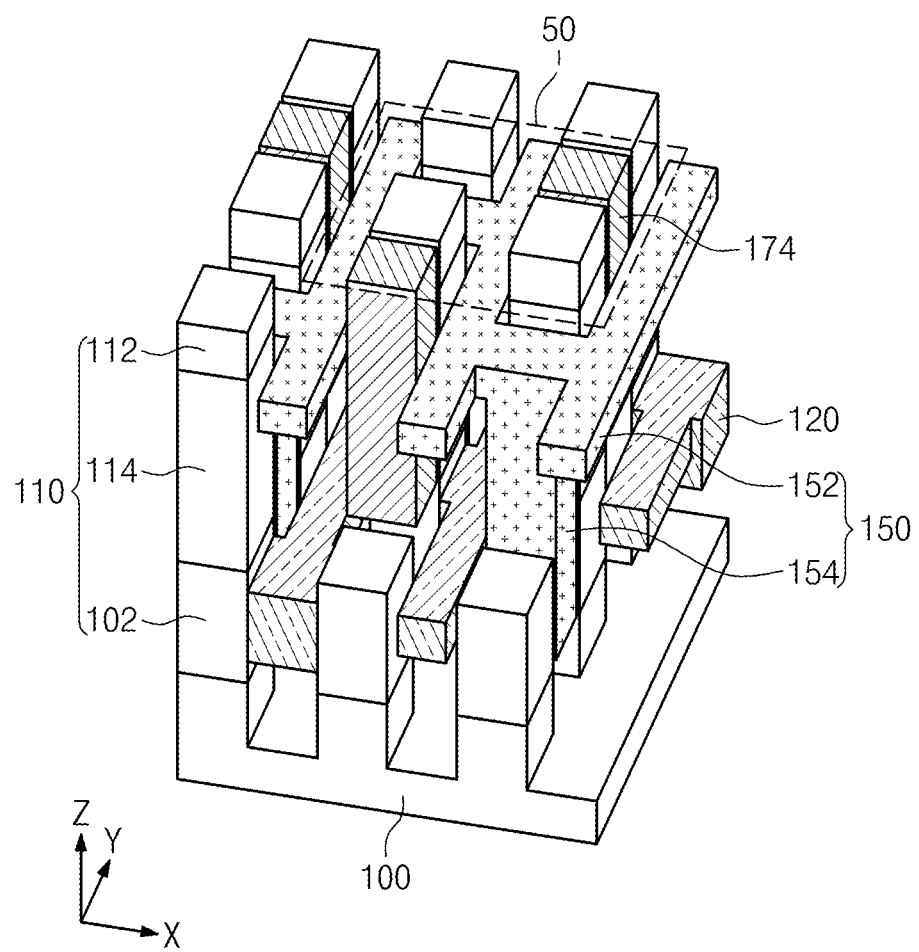
FIG. 1C is a perspective view of a vertical channel transistor of the semiconductor device of FIG. 1A.

As is shown in FIG. 1C, a plurality of back-gates 154 adjacent the active pillars 110, respectively, are connected to each other by the extension line 152, in this embodiment. As is also illustrated in FIG. 1C, the back-gate 154 extends downwardly to a level in the semiconductor device that is beneath that at which the vertical gate 174 terminates. In particular, the back-gate 154 extends downwardly to a level adjacent the lower junction 102. Thus, the back-gate 154 may use the lower junction 102 as a channel. In an example of this embodiment, the vertical gate 174 in combination with the active pillar 110 constitutes an N-type Metal Oxide Semiconductor Field Effect Transistor (NMOSFET), and the back-gate 154 in combination with the active pillar 110 constitutes a P-type Metal Oxide Semiconductor Field Effect Transistor (PMOSFET). Alternatively, the vertical gate 174 in combination with the active pillar 110 may constitute a PMOSFET, and the back-gate 154 in combination with the active pillar 110 may constitute an NMOSFET. However, for simplicity sake, the former example will be referred to in the description that follows since such a description will make the details of the latter example apparent to those of ordinary skill in the art.

Figure 1D:
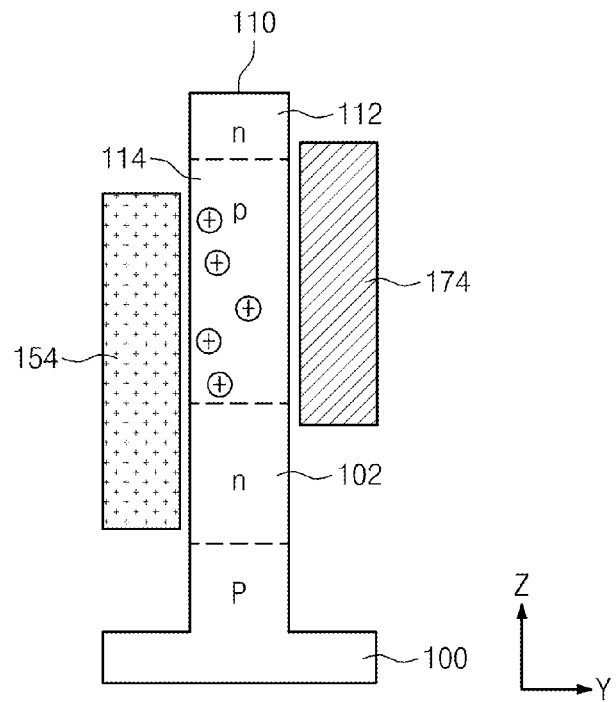
FIGS. 1D and 1E are each a schematic sectional view of the vertical channel transistor illustrating a mode of operation of the transistor.

Reference will now be made to FIG. 1D showing the semiconductor substrate 100 and the vertical channel 114 as P-types (i.e., as having p-type conductivities), and the upper junction 112 and the lower junction 102 as N-types. In this case, therefore, the vertical gate 174, the vertical channel 114, the upper junction 112 and the lower junction 102 constitute an NMOSFET, and the back-gate 154 and the lower junction 102 constitute a PMOSFET. Furthermore, the active pillar 110 is configured as a diode, in which the vertical channel 114 is floated. In this case, holes generated due to Gate Induced Drain Leakage (GIDL) may accumulate in the vertical channel 114 according to this "floating body" effect. If left unattended to, the floating body effect would destabilize the threshold voltage, degrade the dynamic refresh characteristics of the transistor, or abnormally lower the charge (voltage) of the capacitor connected to the active pillar 110.

Figure 1E:
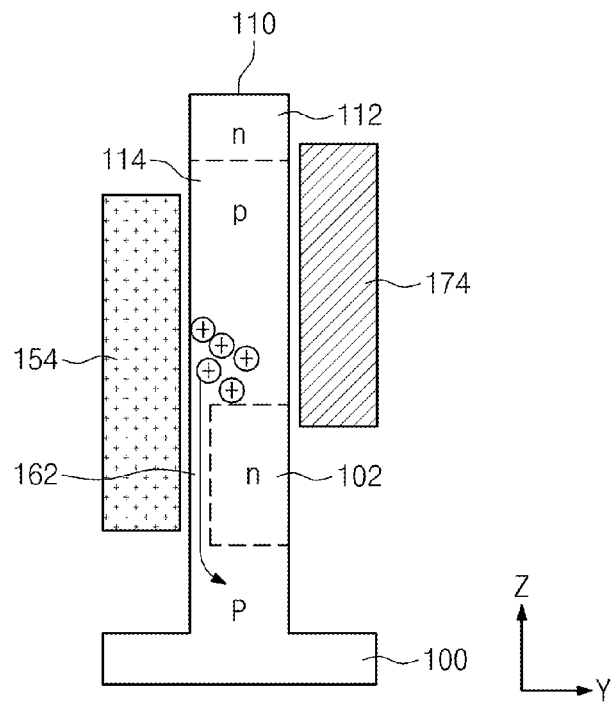

However, in the present embodiment, a portion of the lower junction 102 can be inverted to a P-channel 162 by applying a voltage to the back-gate 154, as illustrated in FIG. 1E. The P-channel 162 provides a path for holes to pass to the semiconductor substrate 100 so that the floating body effect can be prevented. In addition, a potential of the vertical channel 114 can be controlled by not only the vertical gate 174 but also the back-gate 154 due to the presence of the back-gate 154 on one side of the vertical channel 114.

Figure 2A:
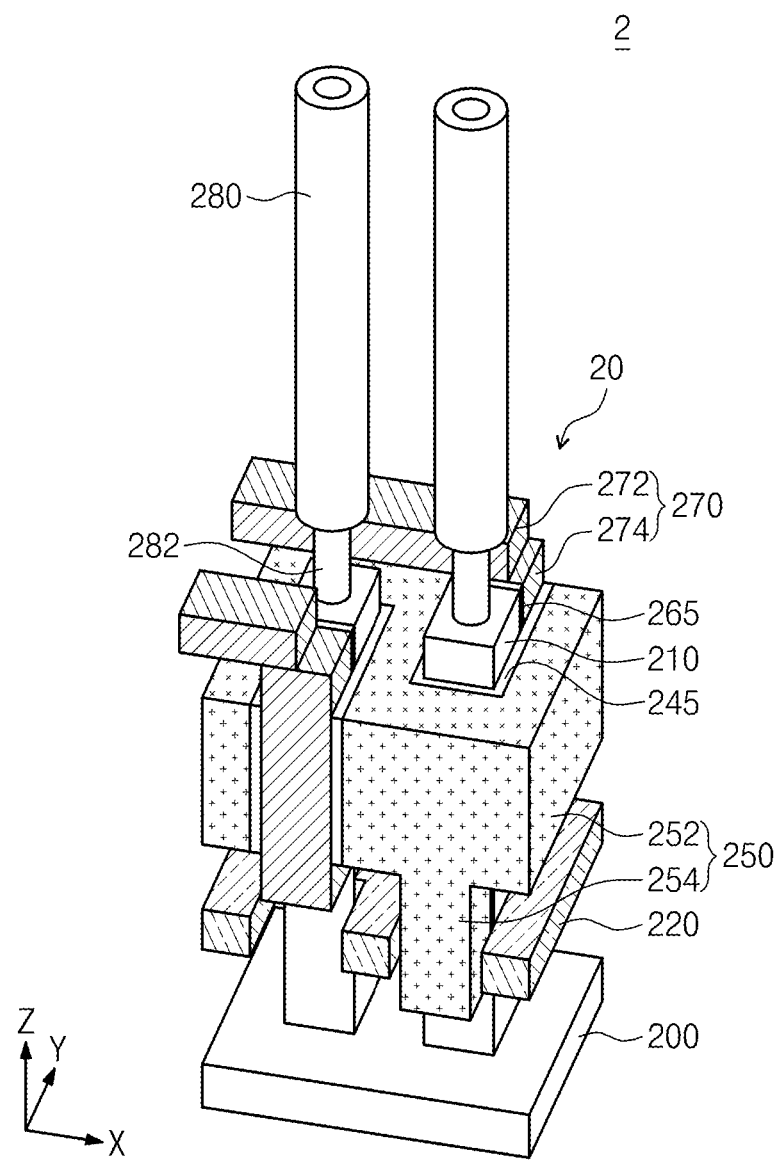
FIG. 2A is a perspective view of another embodiment of a semiconductor device according to the inventive concept.

FIG. 2A illustrates another embodiment of a semiconductor device 2 according to the inventive concept. This embodiment is similar to the embodiment of FIG. 1A and therefore, some of the similar features/aspects will not be described in detail for the sake of brevity.

However, like the embodiment of FIG. 1A, the semiconductor device 2 of this embodiment includes a vertical channel transistor 20 including a vertical gate 274 and a back-gate 254 disposed adjacent opposite sides, respectively, of an active pillar 210 extending upright on a semiconductor substrate 200. The semiconductor device 2 may also include a capacitor 280 electrically connected to the vertical channel transistor 20 through a contact plug 282. A gate dielectric layer 265 is interposed between the vertical gate 274 and one side of the active pillar 210, and a back-gate dielectric layer 245 is interposed between the back-gate 254 and another (the opposite) side of the active pillar 210. A word line 270 may be electrically connected to the vertical gate 274.

Figure 2B:
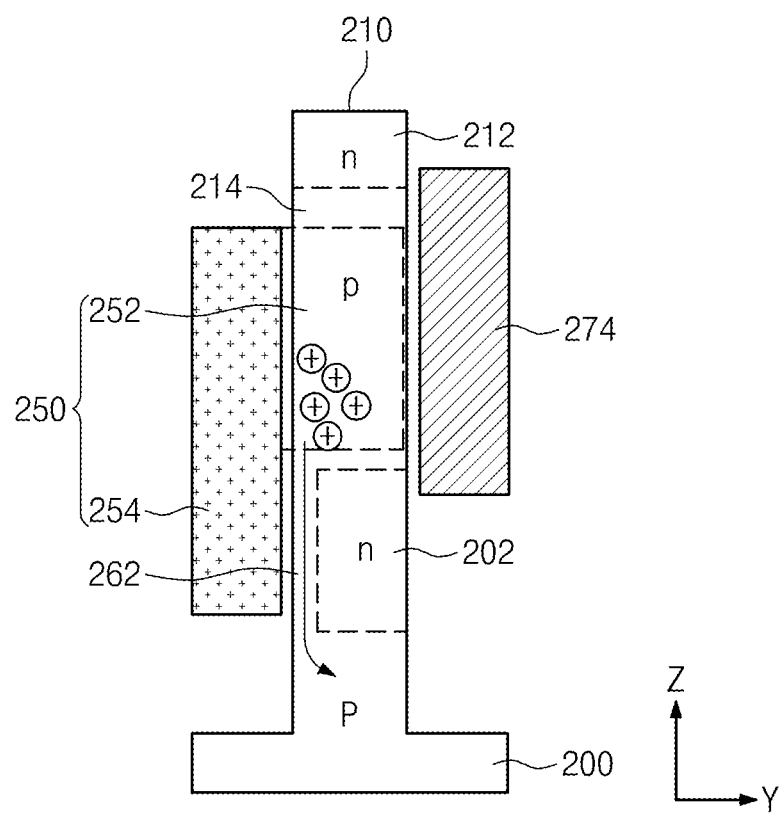
FIG. 2B is a schematic sectional view of a vertical channel transistor of embodiment of the semiconductor device of FIG. 2A, illustrating a mode of operation of the transistor.

A back-gate line 250 (conductor) wraps around three sides of a vertical channel 214 of each active pillar 210 such that the back-gate line 250 can use three sides of the vertical channel 214 as a channel. The back-gate line 250 includes the back-gates 254 (conductive elements) and an extension 252 commonly connected to the back-gates 254. In particular, the extension 252 is configured to envelop three sides of the vertical channel 214. Therefore, a potential of the vertical channel 214 may be controlled by not only the vertical gate 274 but also the back-gate 254 and the extension 252. Furthermore, as illustrated in FIG. 2B, a P-channel 262 can be formed by inverting a portion of a lower junction 202 using the back-gate line 250, to provide a path for holes and thereby mitigating the floating body effect.

Figure 3A:
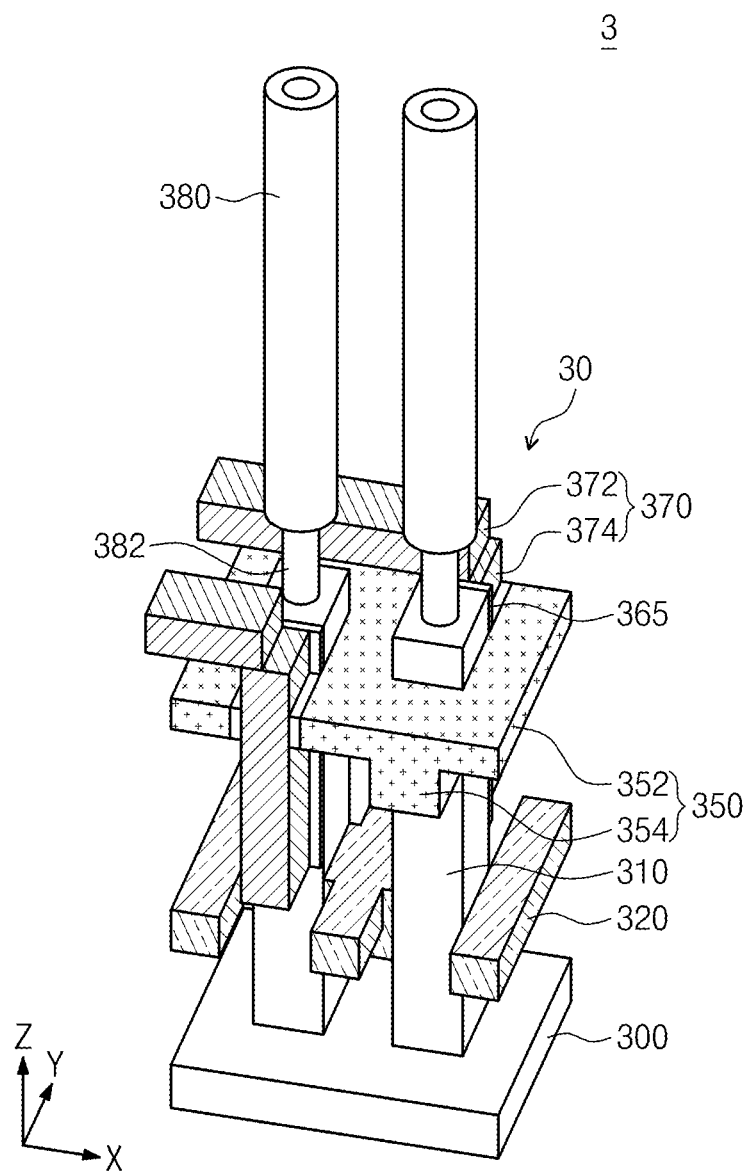
FIG. 3A is a perspective view of still another embodiment of a semiconductor device according to the inventive concept.

FIG. 3A illustrates another embodiment of a semiconductor device 3 according to the inventive concept. This embodiment is similar to the embodiments of FIGS. 1A and 2A and therefore, some of the similar features/aspects will not be described in detail for the sake of brevity.

Referring to FIG. 3A, the semiconductor device 3 includes a vertical channel transistor 30, and a capacitor 380 electrically connected to the vertical channel transistor 30 through a contact plug 382. The vertical channel transistor 30 has an active pillar 310 extending upright on a semiconductor substrate 300, a word line 370 including a vertical gate 374 disposed on one side of the active pillar 310 with a gate dielectric 365 interposed therebetween, a bit line 320 extending in a direction that crosses the word line 370 at substantially right angles, and a body contact line 350 (conductor) directly connected to the other three sides of the active pillar 310.

Figure 3B:
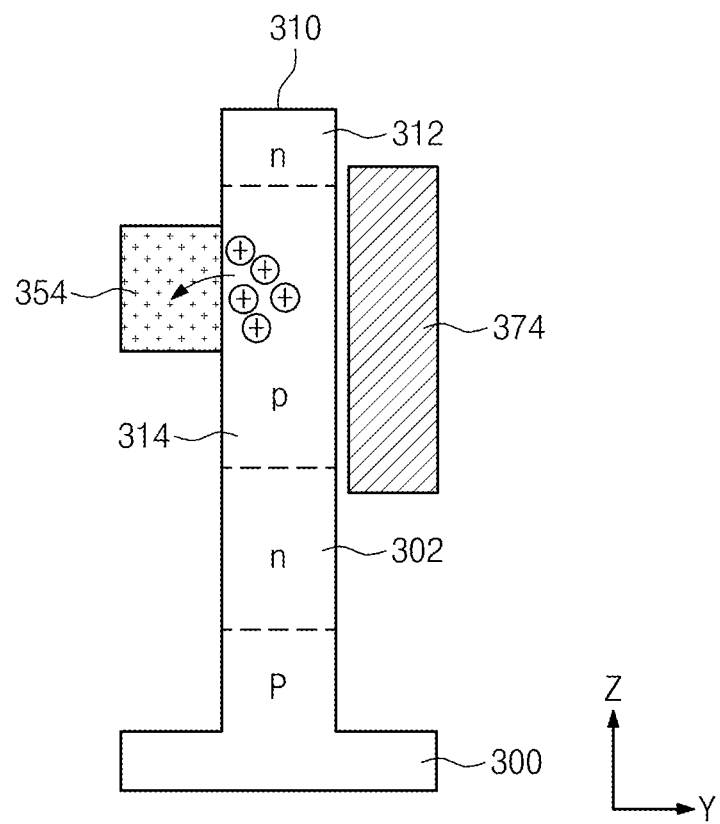
FIG. 3B a schematic sectional view of a vertical channel transistor of embodiment of the semiconductor device of FIG. 3A, illustrating a mode of operation of the transistor.

More specifically, the body contact line 350 includes body contacts 354 (conductive elements), and an extension 352 disposed atop the body contacts 354 and connecting the body contacts 354 in common. The body contact 354, as best shown in FIG. 3B, has height less than that of the vertical gate 374 and is directly connected to one side of the active pillar 310. The extension 352 may be directly connected to each of three sides of the active pillar 310.

Referring still to FIG. 3B, the body contact 354 itself may be used as a path for holes so that the floating body effect may be mitigated. For instance, the body contact 354 may be directly connected to the vertical channel 314 of the active pillar 310. Therefore, holes accumulated in the vertical channel 314 may be drained from the vertical channel 314 via the body contact 354.

Figure 4A:
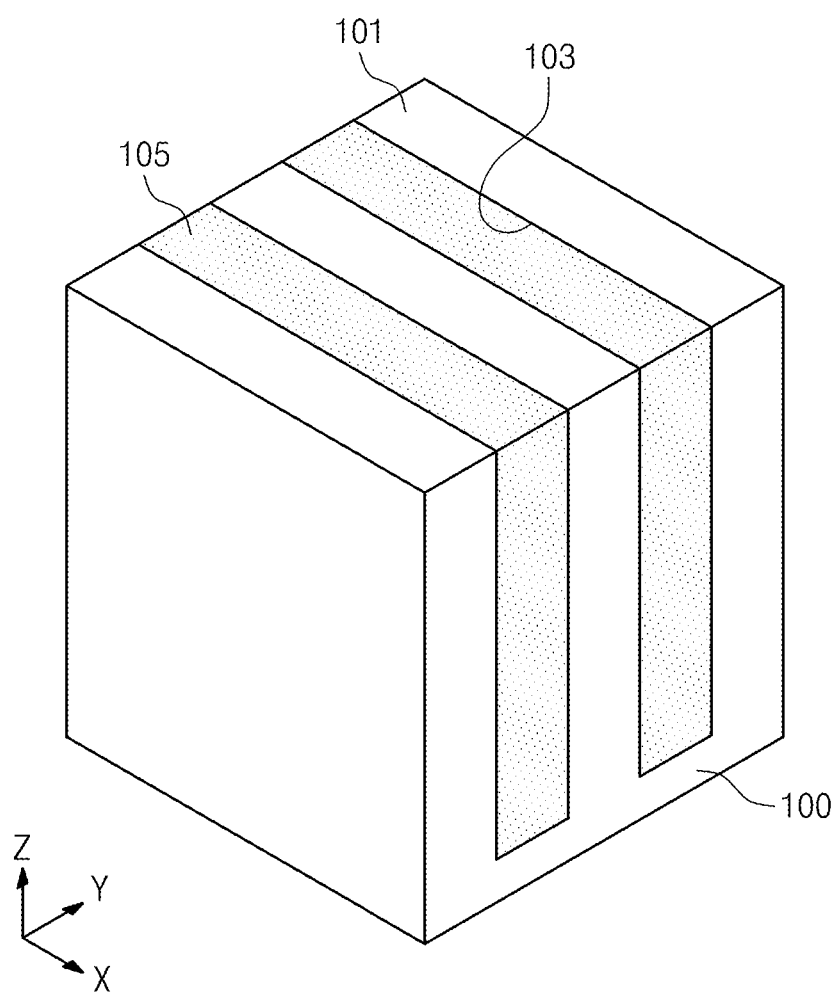
FIGS. 4A to 4P are perspective views illustrating a method of fabricating the semiconductor device, of FIG. 1A, according to the inventive concept.
Figure 4B:
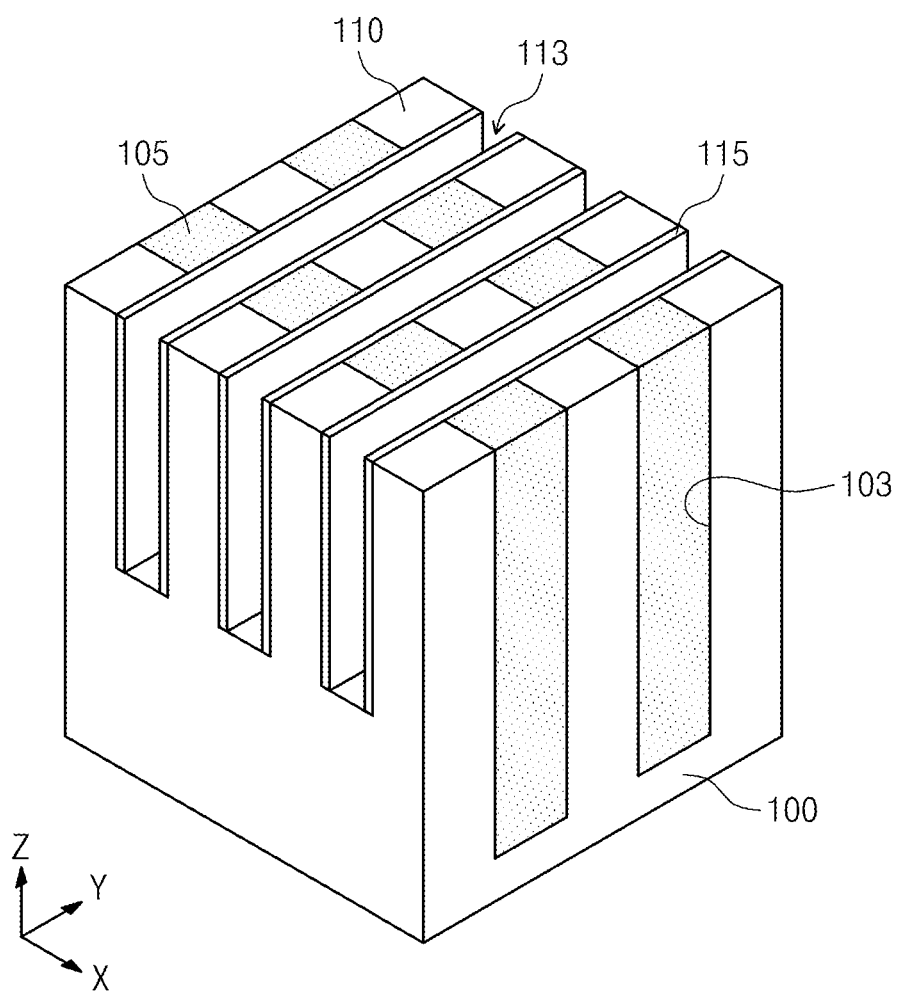
Figure 4C:
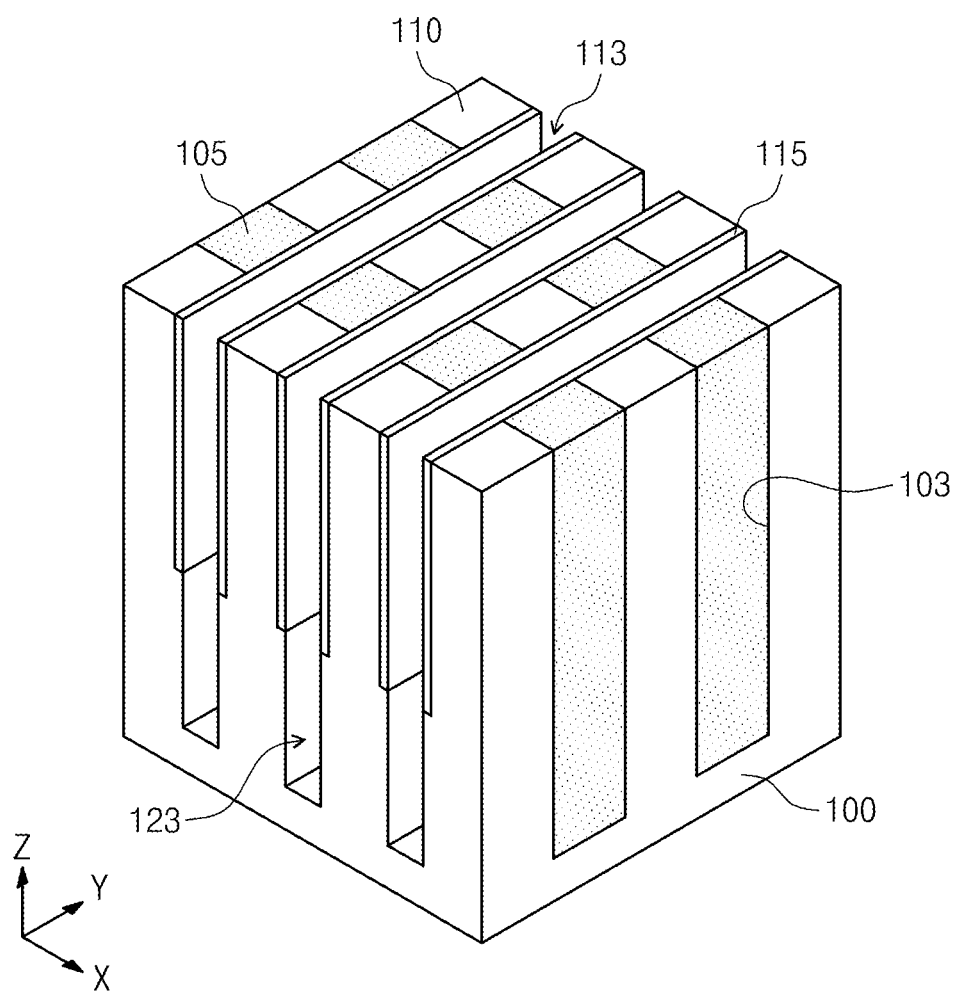
Figure 4D:
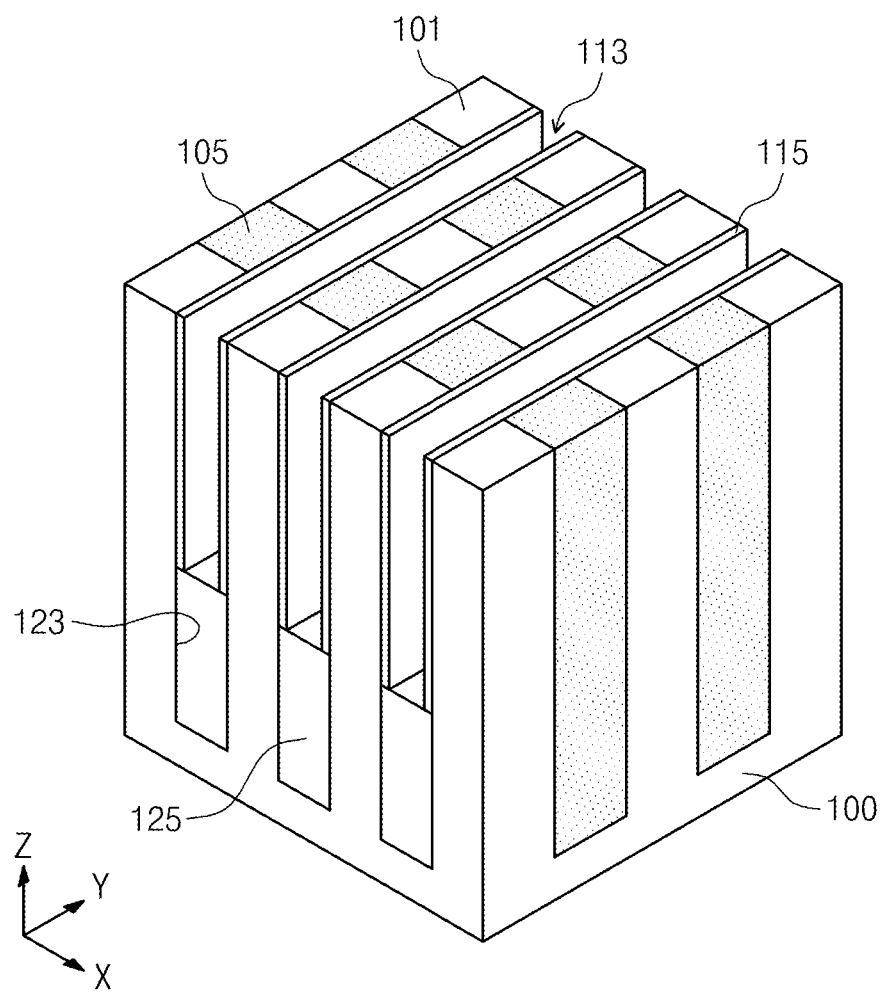
Figure 4E:
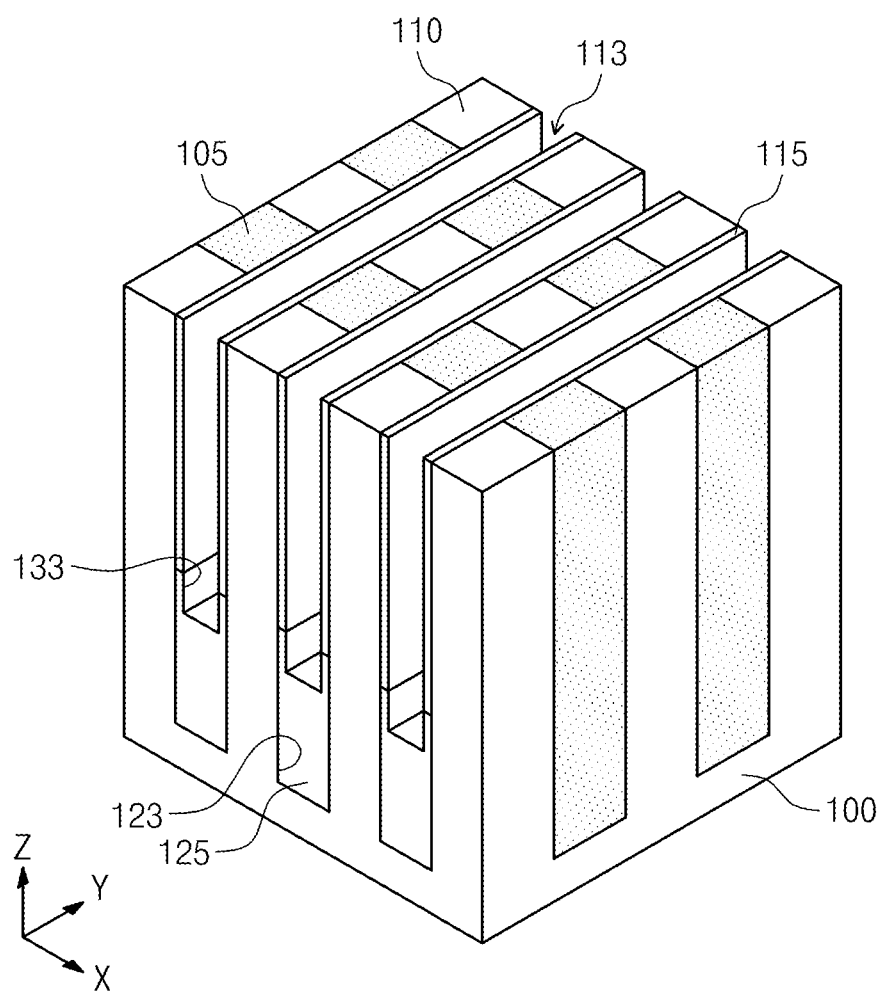
Figure 4F:
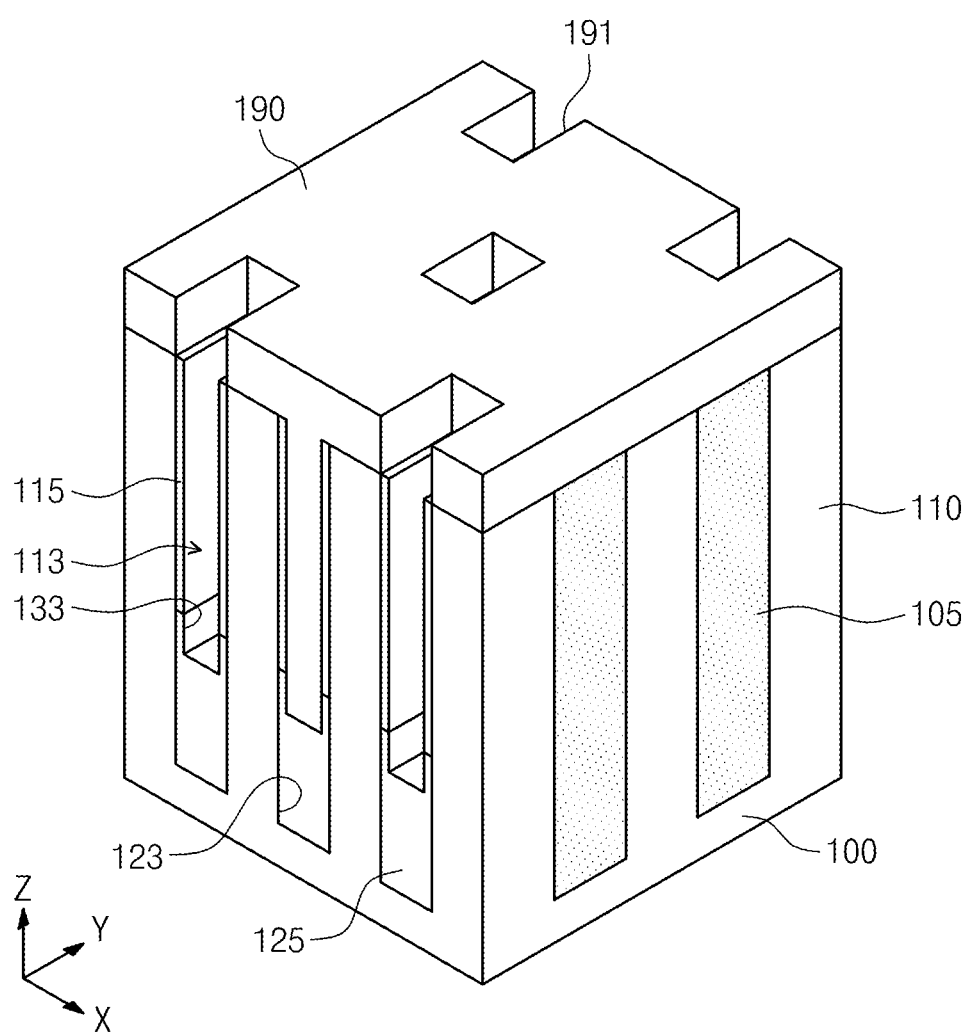
Figure 4G:
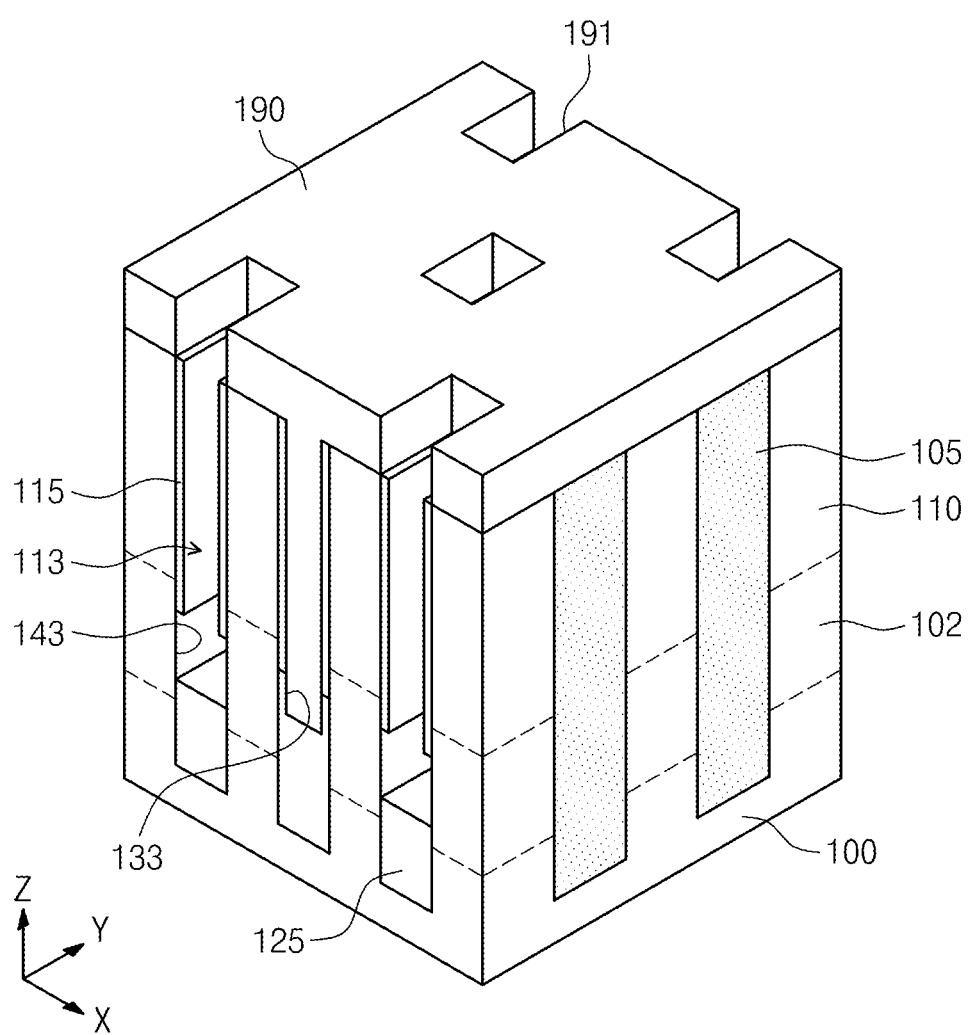
Figure 4H:
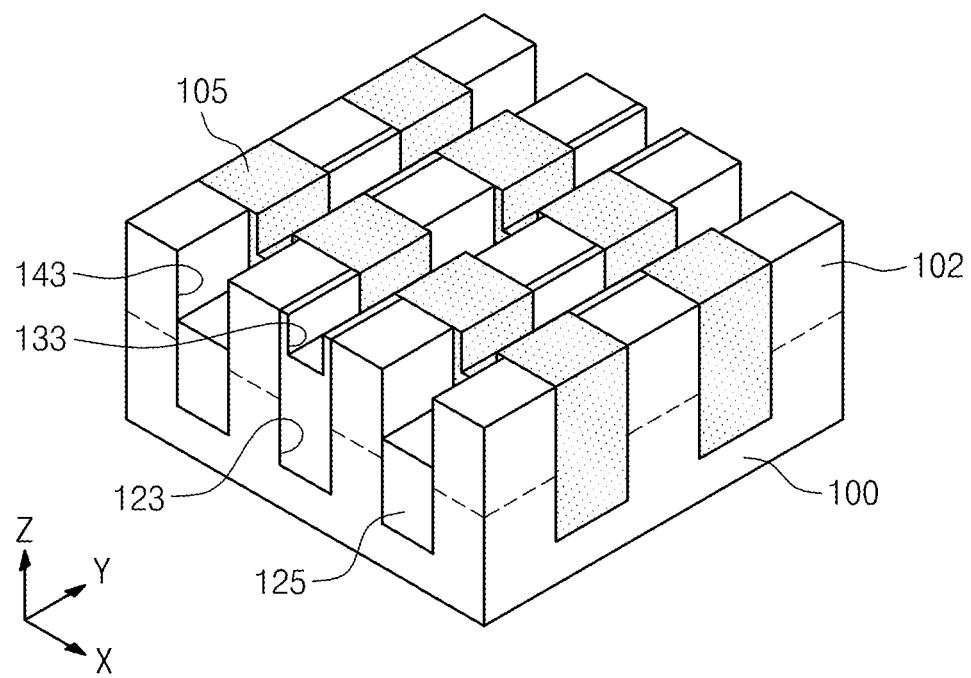
Figure 4I:
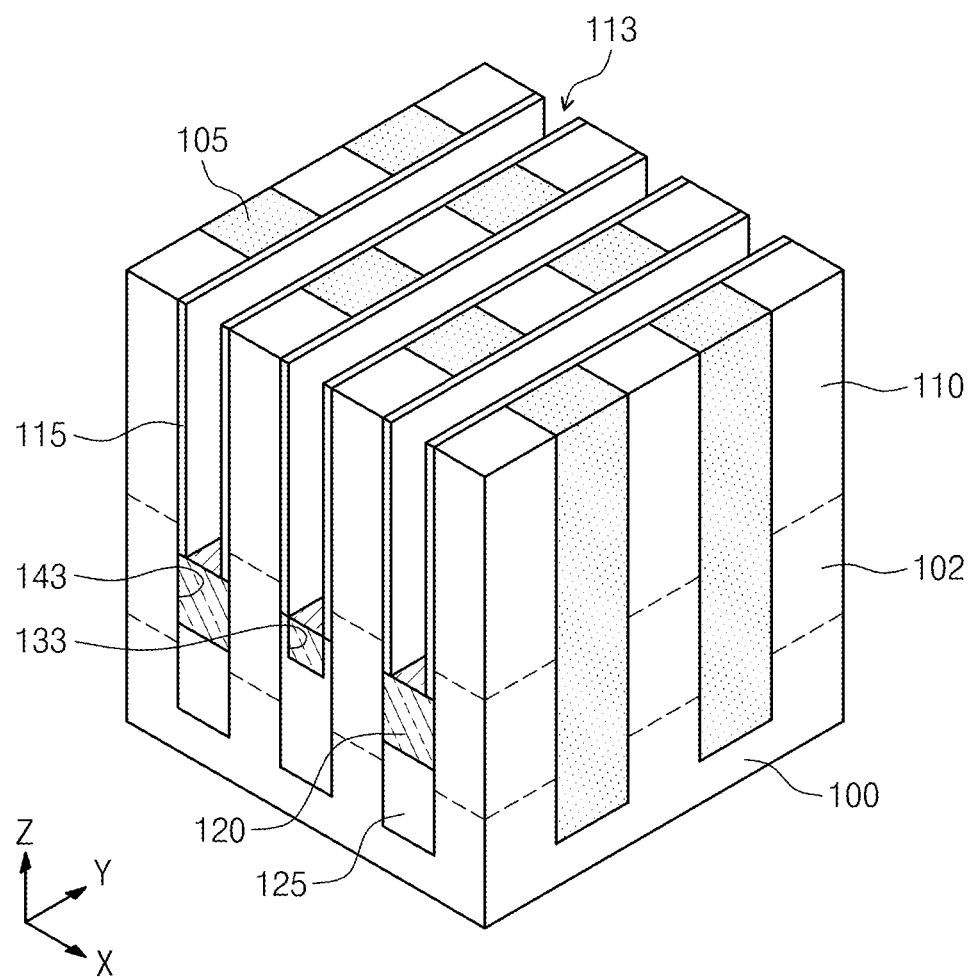
Figure 4J:
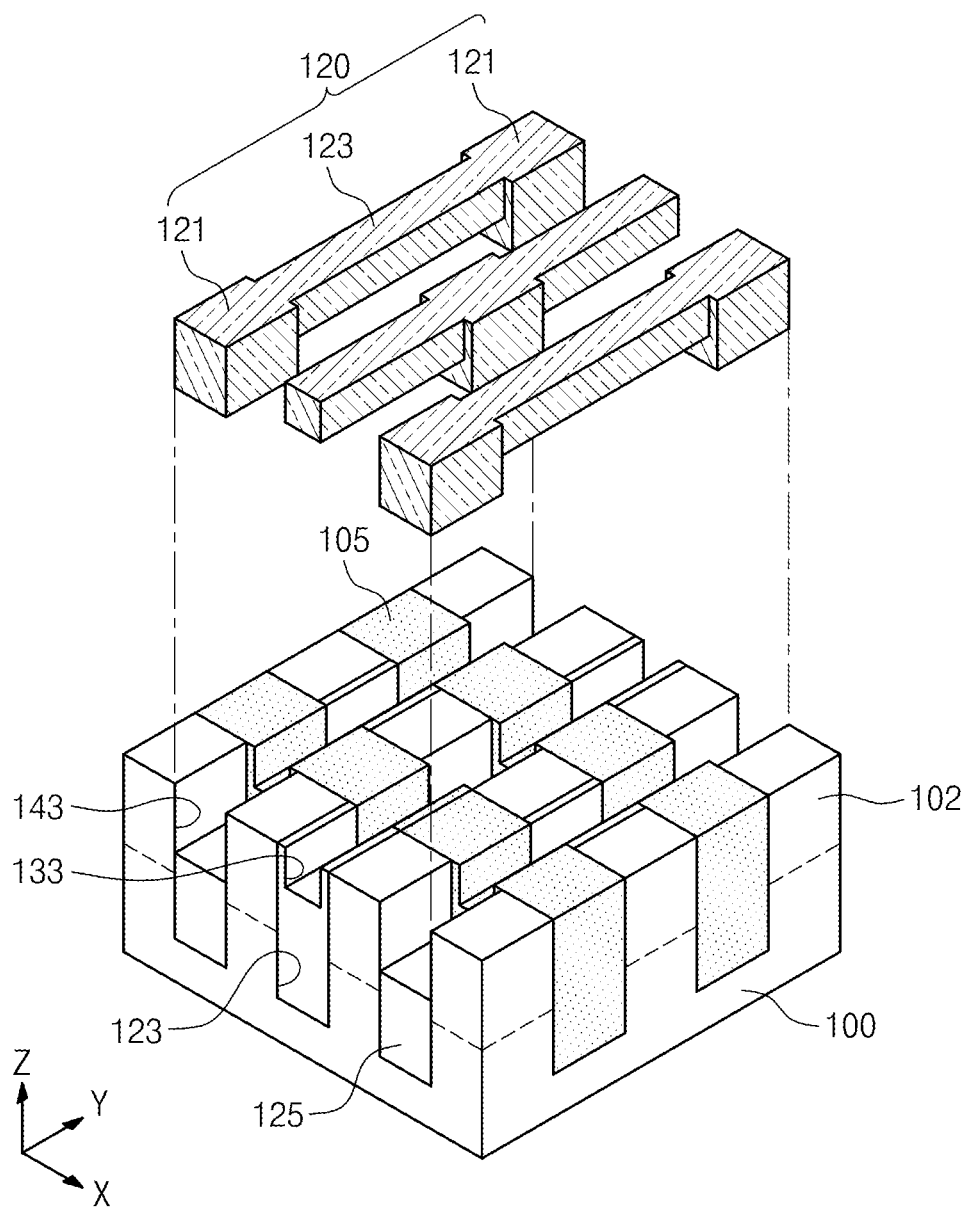
Figure 4K:
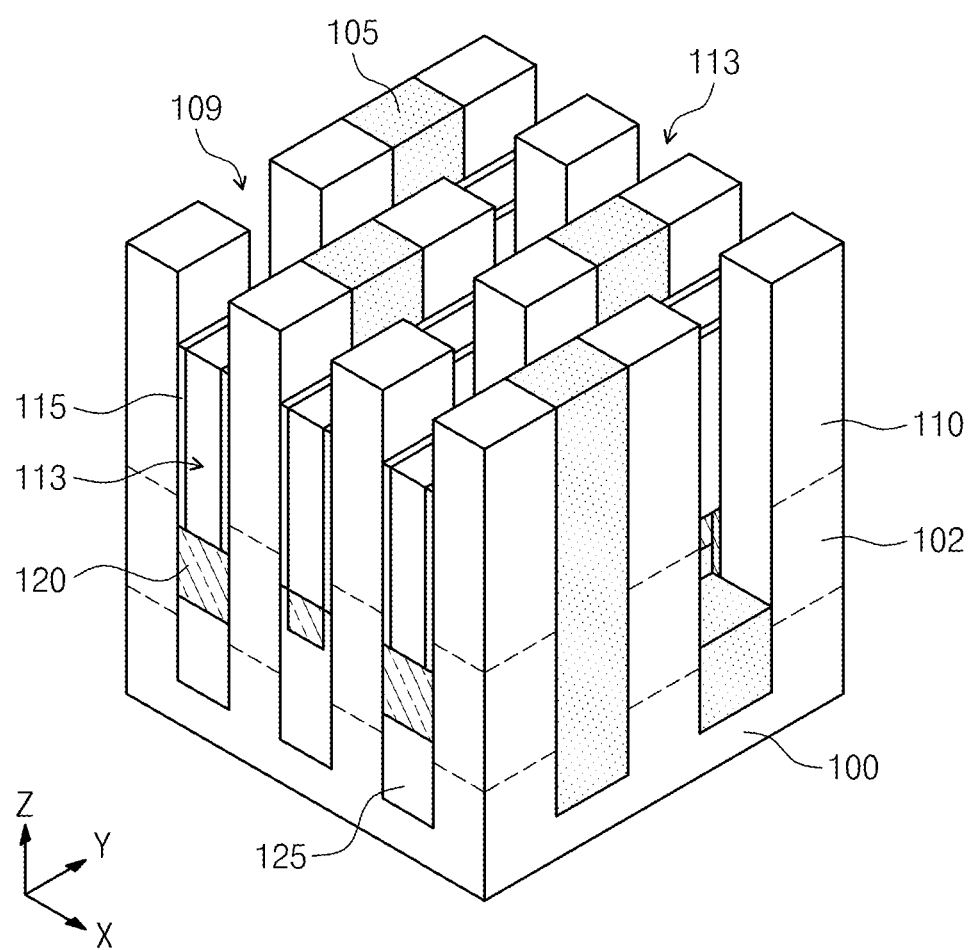
Figure 4L:
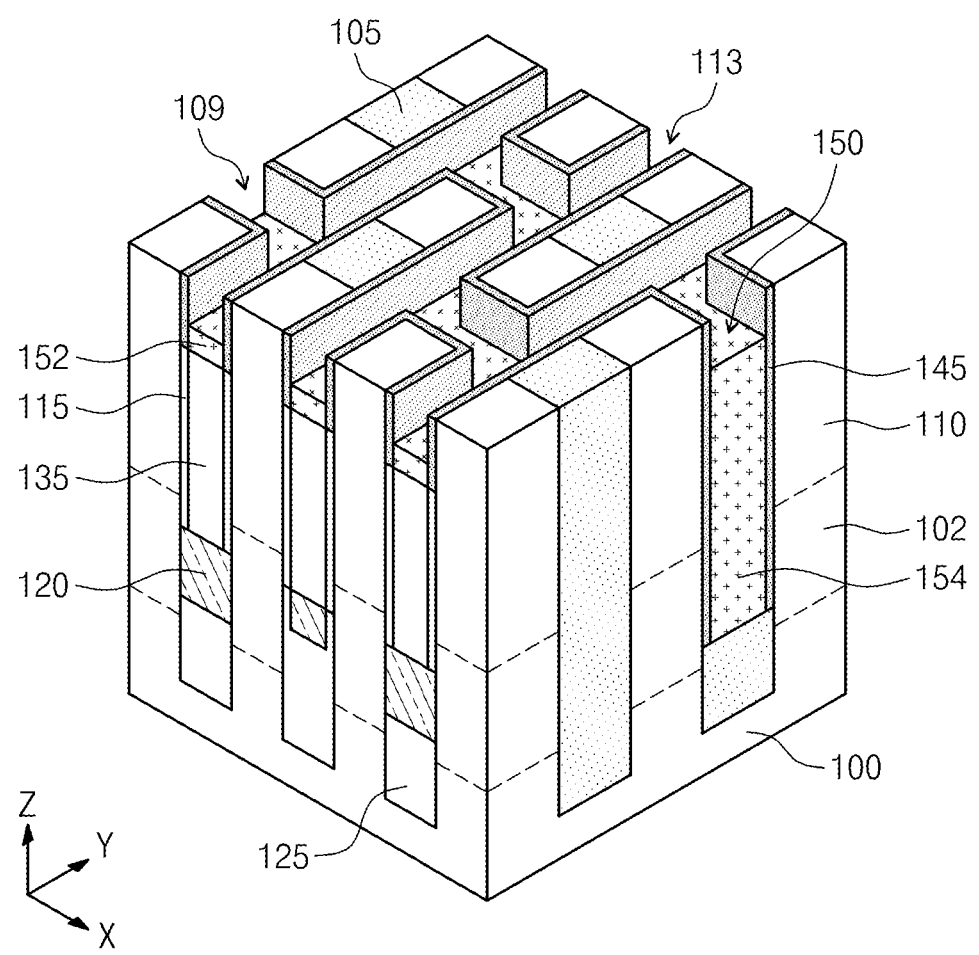
Figure 4M:
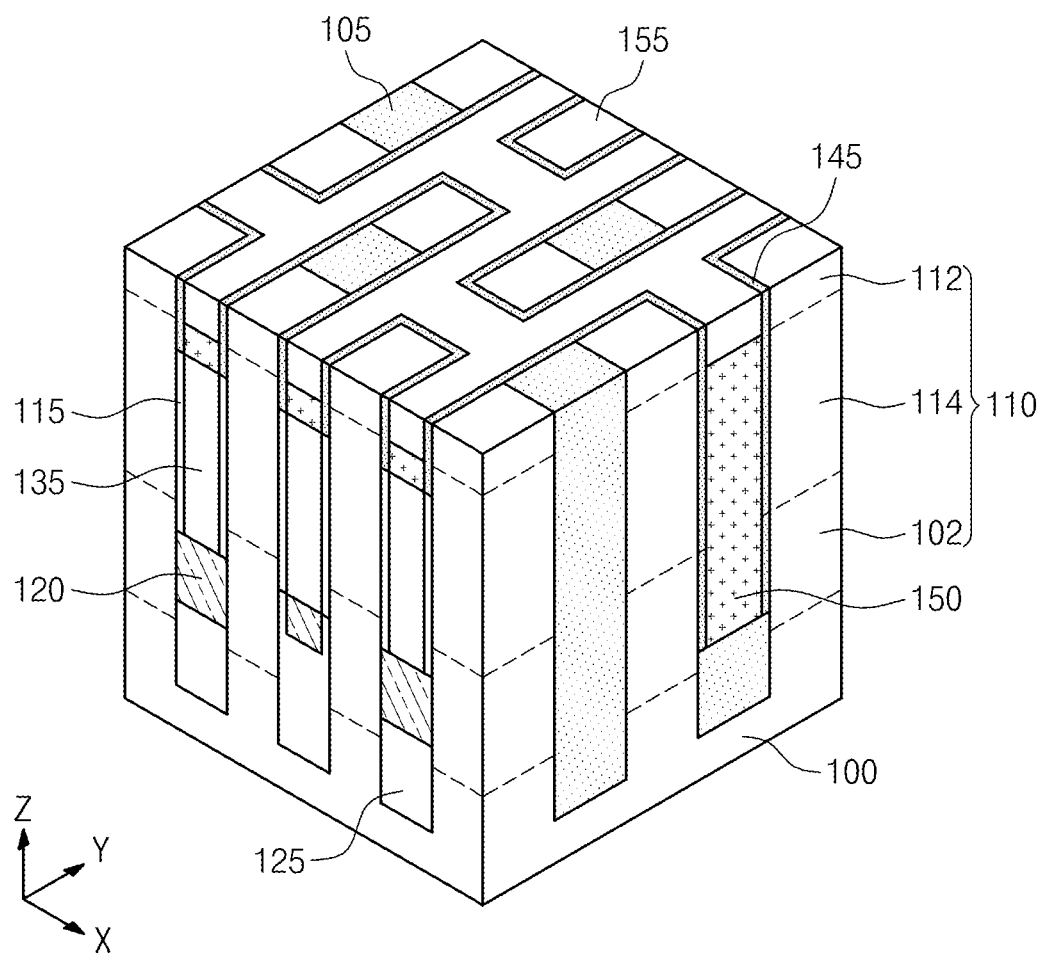
Figure 4N:
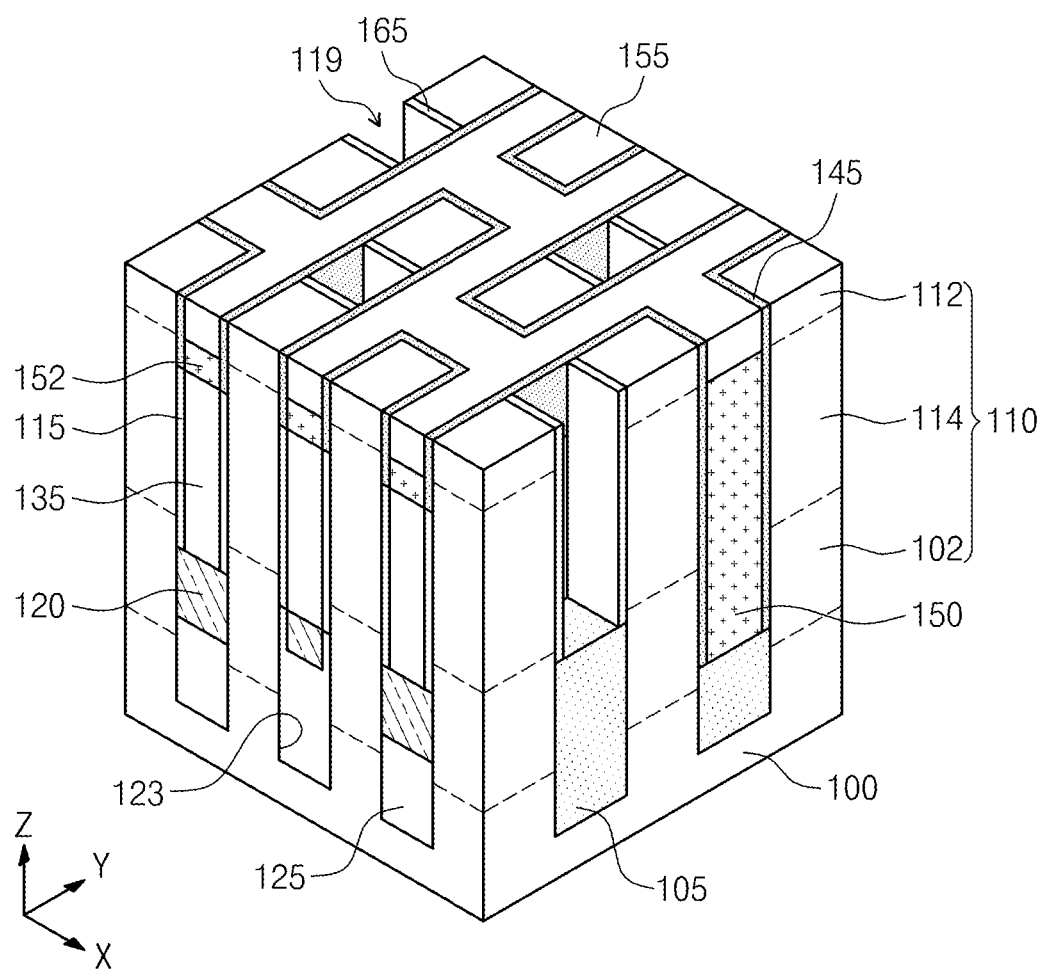
Figure 40:
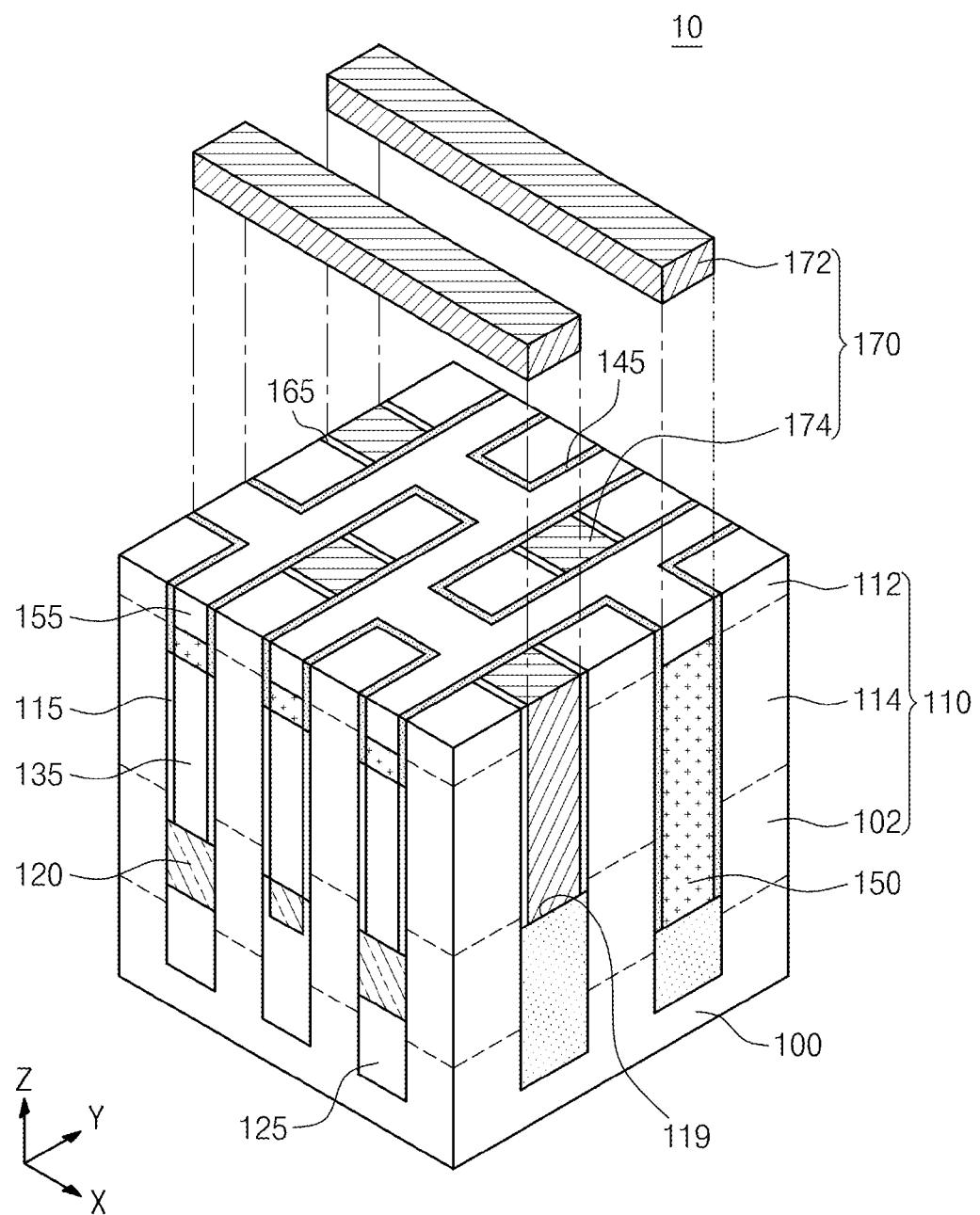
Figure 4P:
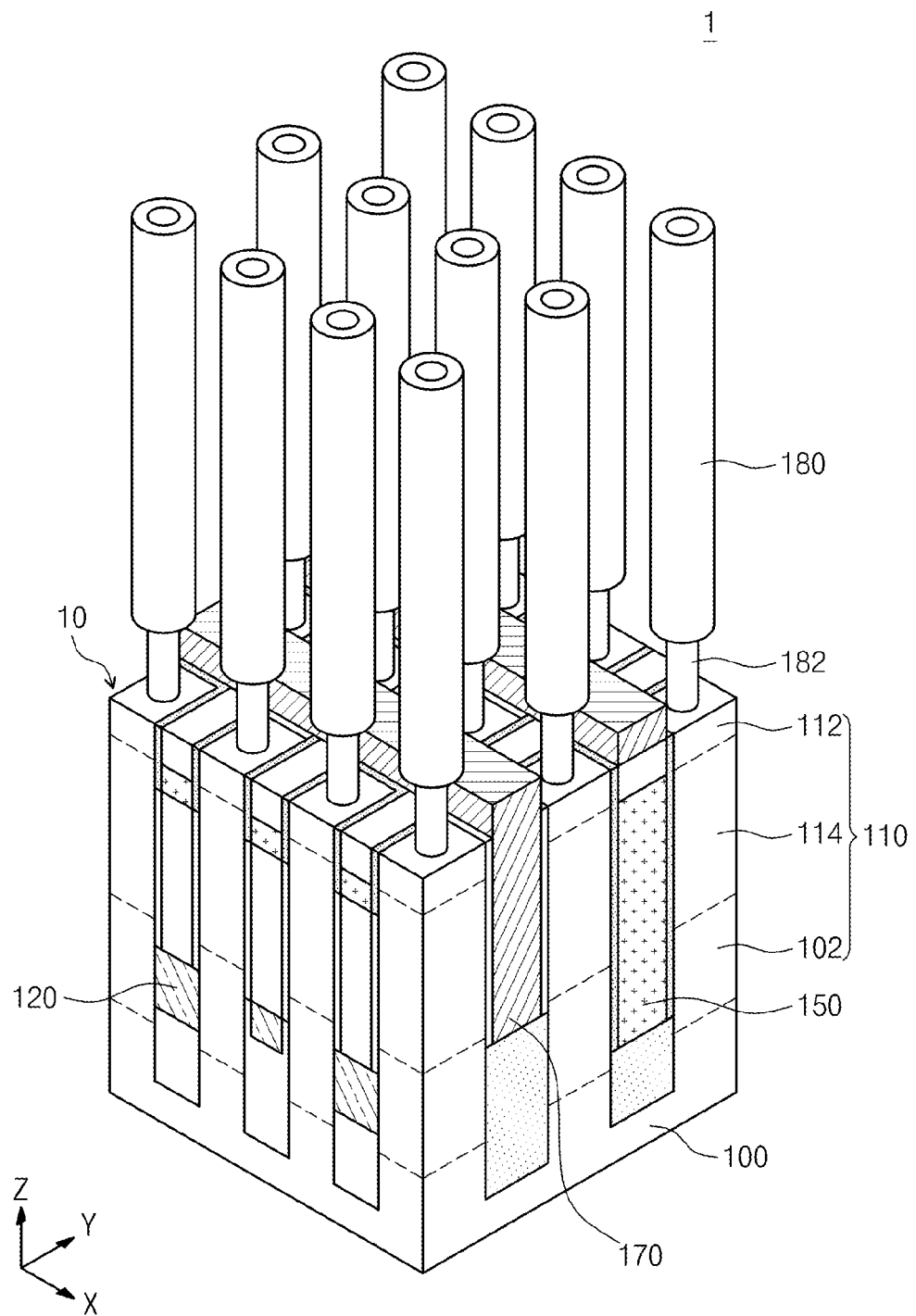

FIGS. 4A to 4P illustrate an embodiment of a method of fabricating a semiconductor device according to the inventive concept. Details of certain specifics of the features/elements formed by the processes described with reference to these figures have been described with reference to FIGS. 1A and 1B and therefore, will not be described again in detail.

Referring to FIG. 4A, a semiconductor substrate 100 is provided. The semiconductor substrate 100 may be a P-type substrate such as a silicon wafer or an SOI wafer including semiconductor material. First trenches 103 each extending longitudinally in an X-direction are formed in the semiconductor substrate 100, and a device isolation layer 105 is formed by depositing an insulator such as silicon oxide in the first trenches 103. An active region 101 is defined by the device isolation layer 105. The active region 101 is thus basically constituted by a wall of the substrate 100 extending upright in the X-Z plane Referring to FIG. 4B, second trenches 113 are formed in the semiconductor substrate 100 in a Y-direction substantially perpendicular to the X- and Z-directions. In this embodiment, the second trenches 113 are shallower than the first trenches 103. Accordingly, the active region 101 assumes the form of active pillars 110 protruding from a base of the substrate 100 in the Z-direction. Furthermore, each active pillar 110 will thus have the same conductivity as the semiconductor substrate 100, e.g., a P-type conductivity. Next, a sidewall insulating layer 115 is formed on inner surfaces of the substrate 100 which delimit the sides of the second trenches 113. The sidewall insulating layer 115 may be formed by depositing silicon nitride in the second trenches 113.

Referring to FIG. 4C, third trenches 123 extending in the Y-direction are formed in the semiconductor substrate 100. More specifically, portions of the semiconductor substrate 100 exposed by the second trenches 113 are removed using a wet or dry etching process to form the third trenches 123. At this time, the sidewall insulating layer 115 protects the active pillars 110. As a result, the third trenches extend downwardly from the second trenches 113, respectively. In this respect, the third trench 123 may be narrower than the second trenches 113. Furthermore, the third trenches 123 may be formed to the same depth as, deeper than, or shallower than the first trenches 103.

Referring to FIG. 4D, a lower insulating layer 125 is formed to fill the third trenches 123. The lower insulating layer 125 may be formed by depositing insulating material in the second/third trenches and then etching back (recessing) the resulting layer, or by thermally treating the substrate 100 to oxidize the surfaces that delimit the sides of the third trenches 123. In the case of the thermal oxidation process, atoms, e.g., Si, which constitute the sidewalls are oxidized. Therefore, within a particular trench 113/123, the lower insulating layer 125 may have a width greater than the distance between outer surfaces of the opposing sidewall insulating layers 115.

Referring to FIG. 4E, fourth trenches 133 are formed by patterning the lower insulating layer 125, e.g., by dry-etching or wet-etching the lower insulating layer 125. Thus, the fourth trenches 133 extend in the Y-direction. Furthermore, the fourth trenches 133 are formed to a depth less than that of the third trenches 123 and may have a width similar to (the same or substantially the same as) that of the second trenches 113.

Referring to FIG. 4F, a mask 190 which covers some of the fourth trenches 133 and has openings 191 exposing others is formed on the substrate 100 by, for example, coating the substrate with a layer of photoresist and patterning the photoresist layer. The openings 191 are formed in rows (and columns) and the openings 191 of adjacent rows (and columns) are staggered, for reasons that will be apparent in the description that follows. That is, the specific locations of the openings 191 relative to the underlying structure will become apparent from the description of the method that follows.

Referring to FIGS. 4G and 4H, the lower insulating layer 125 exposed through the opening 191 is etched to form fifth trenches 143 in the Y-direction. The fifth trenches 143 are contiguous with alternately disposed ones of the fourth trenches 133, respectively. That is, a fifth trench 143 is formed with every other fourth trench 133 as especially shown in the cut-away view of FIG. 4H.

Than, lower junctions 102 are formed by injecting impurities into the sidewalls exposed by the fifth trenches 143. For instance, in the case in which the semiconductor substrate 100 is a P-type (or N-type) substrate, N-type (or P-type) impurities are injected.

Referring to FIGS. 4I and 4J, bit lines 120 extending longitudinally in the Y-direction are formed by, for example, depositing material such as metal or polysilicon in the fourth trenches 133 and the fifth trenches 143, and then etching back the resulting layer.

Referring to FIG. 4K, a first capping insulating layer 135 covering the bit lines 120 is formed by depositing insulating material, such as silicon oxide or silicon nitride, in the second trenches 113, and then etching back (wet or dry etching) the resulting insulating layer. The sidewall insulating layer 115 may also be etched back (recessed) when the first capping insulating layer 135 is formed. Then, a plurality of first holes 109 are formed by etching the device isolation layer 105. The first holes 109 are formed in rows and the first holes 109 in each row are staggered with respect to the first holes 109 in an adjacent row. The first holes 109 are formed to such a depth that all of or almost the entirety of each lower junction 102 is exposed.

Referring to FIG. 4L, a back-gate dielectric 145 is formed by depositing silicon oxide on surfaces that delimit the sides of the first holes 109. Before this process takes place, though, the first capping insulating layer 135 can be etched back (recessed) so that the back-gate dielectric 145 is also formed on surfaces delimiting sides of respective ones of the second trenches 113. Although not illustrated in the drawing for the sake of clarity, the back-gate dielectric 145 may also be formed on top surfaces of the active pillars 110 and the device isolation layer 105.

Subsequently, material for forming a conductor, such as polysilicon or metal, is deposited in the first holes 109 and etched back (recessed) to form back-gate line having back-gates 154 and extension 152.

Referring to FIG. 4M, a second capping insulating layer 155 is formed over the back-gate line 150 by depositing insulating material, such as silicon oxide or silicon nitride, in the second trenches 113 and openings 109. Next, impurities are injected into the tops of the active pillars 110 to form upper junctions 112. Thus, the upper junctions 112 are self-aligned.

Referring to FIG. 4N, the device isolation layer 105 is etched (recessed) so that a plurality of second holes 119 are formed. More specifically, in this example, the device isolation layer 105 is wet or dry etched to form second holes 119 to such a depth that they expose the upper junctions 112 and the vertical channels 114. The second holes 119 may also be formed to such a depth that they expose portions only of the lower junctions 102. Then a gate dielectric 165 is formed on surfaces delimiting sides of the second holes 119. For example, silicon oxide can be deposited on such surfaces, or the substrate can be thermally treated so that the surfaces are oxidized. Although not illustrated in the drawing for the sake of clarity, the gate dielectric 165 may also be formed on the top surfaces of the upper junctions 112.

Referring to FIG. 4O, word lines 170 are formed by deposition and patterning processes. More specifically, material such as polysilicon or a metal, for forming a conductor, is deposited on the structure to overfill the second holes 119. The resulting layer is patterned to form world lines 170 which each include several vertical gates 174 occupying respective ones of the second holes 119 and extending in the Z-direction, and an extension 172 connecting the vertical gates 174 and extending in the X-direction.

Vertical channel transistors 10 are formed as a result of the above-described processes.

Referring to FIG. 4P, capacitors 180 are formed as electrically connected to the vertical channel transistors 10, respectively. For instance, contact plugs 182 connected to the upper junctions 112 of the active pillar 110 can be formed, and then the capacitors 180 can be formed as connected to the contact plugs 182.

Thus, a semiconductor device 1 such as a DRAM can be formed.

FIGS. 5A to 5D illustrate essential steps in another embodiment of a method of fabricating a semiconductor device according to the inventive concept.

Figure 5A:
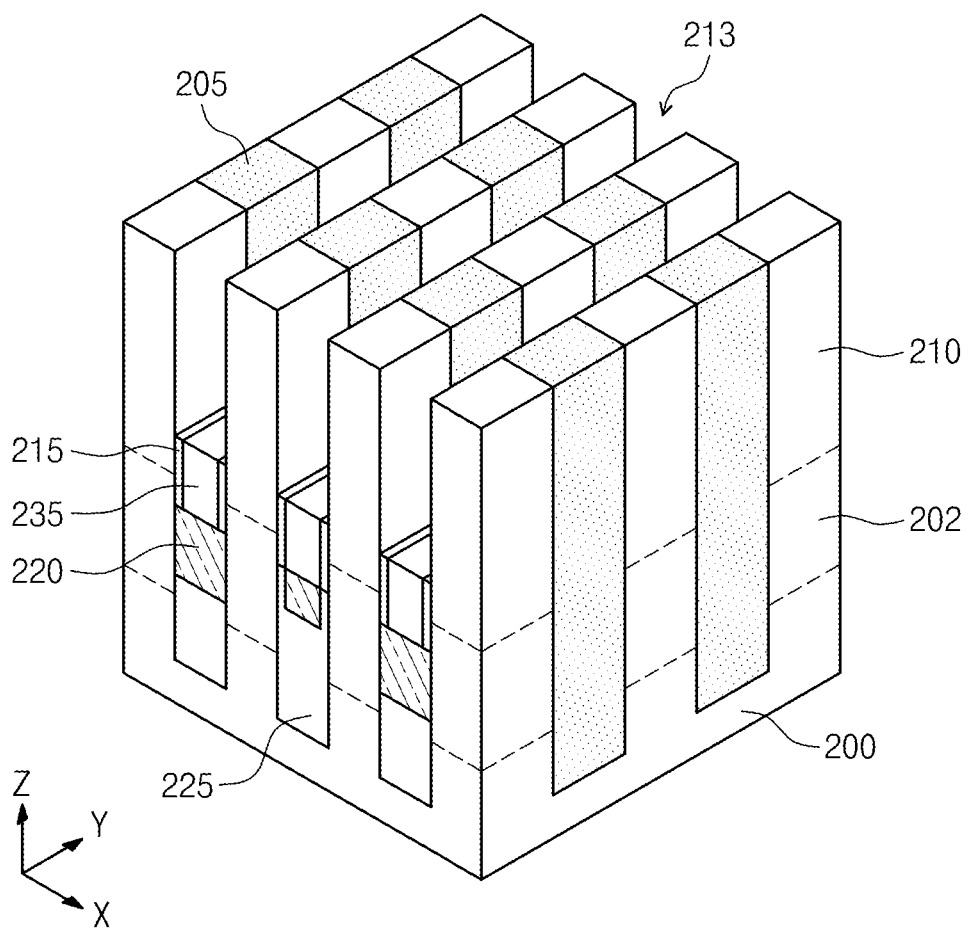
FIGS. 5A to 5D are perspective views illustrating a method of fabricating the semiconductor device of FIG. 2A, according to the inventive concept.

Referring to FIG. 5A, a plurality of active pillars 210 are formed by forming a device isolation layer 205 having sections each extending in an X-direction and second trenches 213 each extending in a Y-direction, through processes which are identical or similar to the processes illustrated in and described with reference to FIGS. 4A to 4K. Then, lower junctions 202 are formed at lower parts of the active pillars 210. Next, bit lines 220 extending in the Y-direction, and a first capping insulating layer 235 covering the bit lines 220 are formed. The first capping insulating layer 235 is formed by deposition and etch back processes such that its upper surface is disposed adjacent the top surfaces of the lower junctions 202. A sidewall insulating layer 215 is formed along the sides of the second trenches 213, and may be etched back together with the first capping insulating layer 235.

Figure 5B:
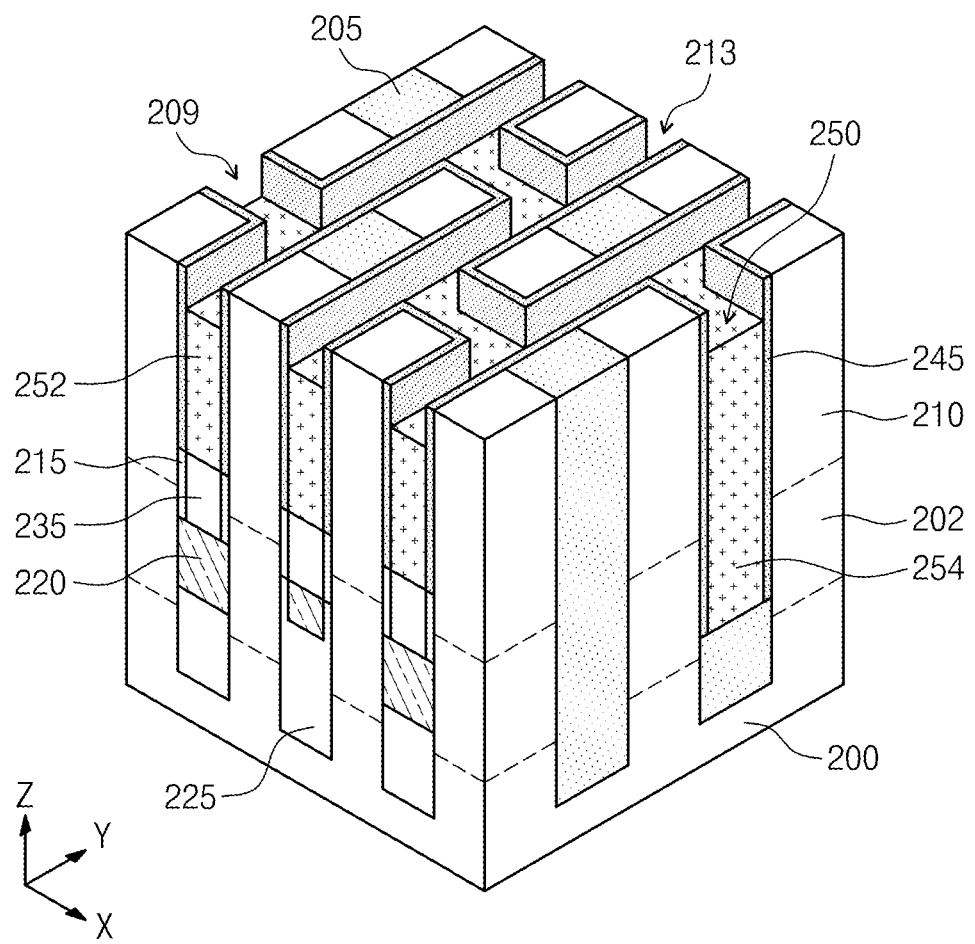

Referring to FIG. 5B, first holes 209 are formed by etching back parts of the device isolation layer 205, and back-gate dielectric 245 are formed along the sides of the first holes 209 and second trenches 213 by processes similar to those illustrated in and described with reference to FIGS. 4K and 4L. And, a back-gate line 250, which includes back-gates 254 filling the first holes 209 and an extension 252 filling the second trenches 213, are formed. Accordingly, in this embodiment, the extension line 252 extends terminates at or just above the lower junctions 202.

Figure 5C:
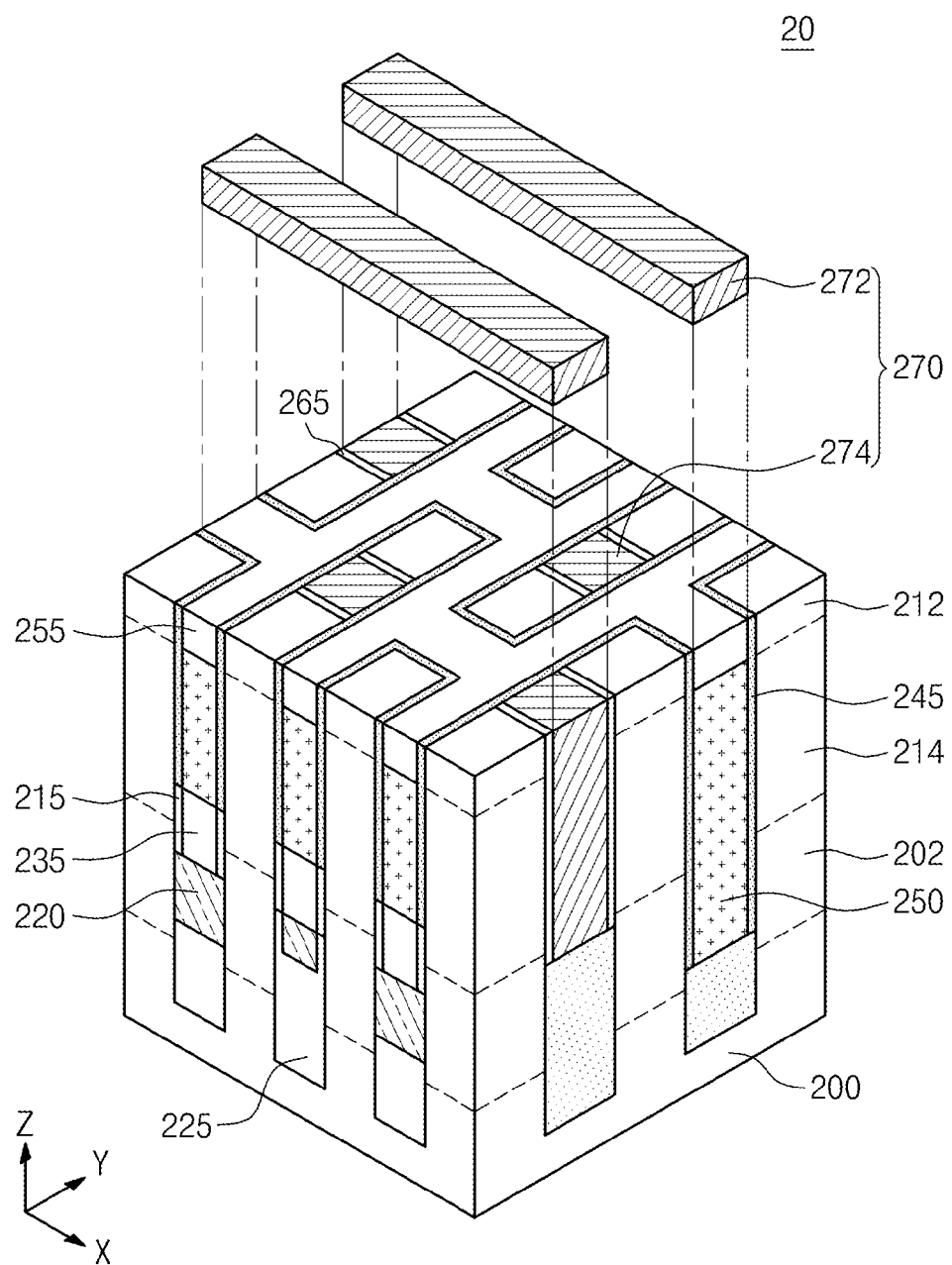

Referring to FIG. 5C, a vertical channel transistor 20 is then completed by forming a second capping insulating layer 255, upper junctions 212, and word lines 270 by processes which are similar to those illustrated in and described with reference to FIGS. 4M to 4O. In this embodiment, the back-gate line 250 envelops three sides of each vertical channel 214 with the back-gate dielectric 245 sandwiched therebetween, as was illustrated in and described in detail with reference to FIG. 2A.

Figure 5D:
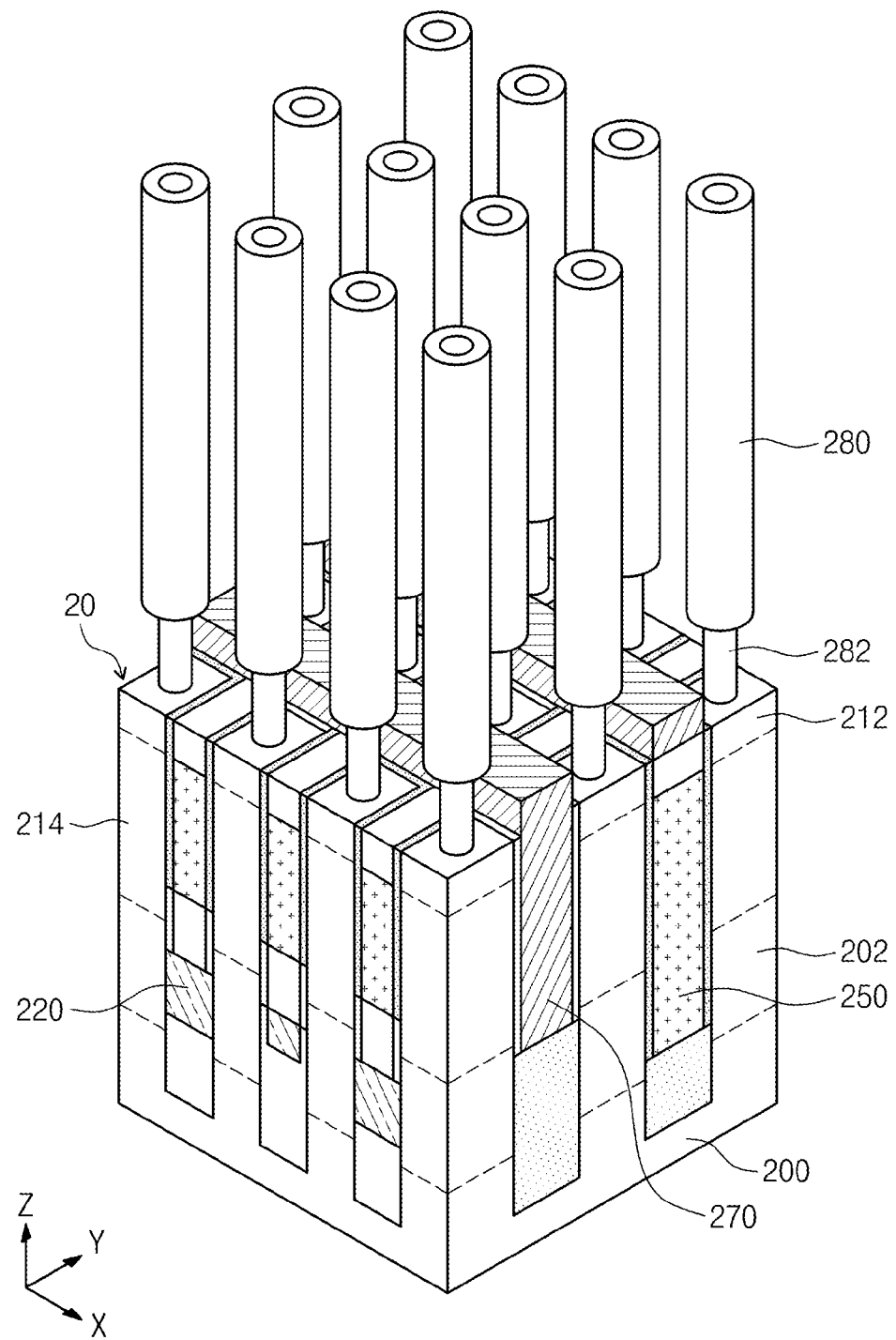

Referring to FIG. 5D, capacitors 280 are formed as electrically connected to the vertical channel transistor 20. In this respect, contact plugs 282 may be formed before the capacitors 280, such that the capacitors 280 are electrically connected to the upper junctions 212 of the vertical channel transistor 20 by the contact plugs 282, respectively.

Thus, a semiconductor device 2 such as a DRAM can be formed.

FIGS. 6A to 6D illustrate essential steps in another embodiment of a method of fabricating a semiconductor device according to the inventive concept.

Figure 6A:
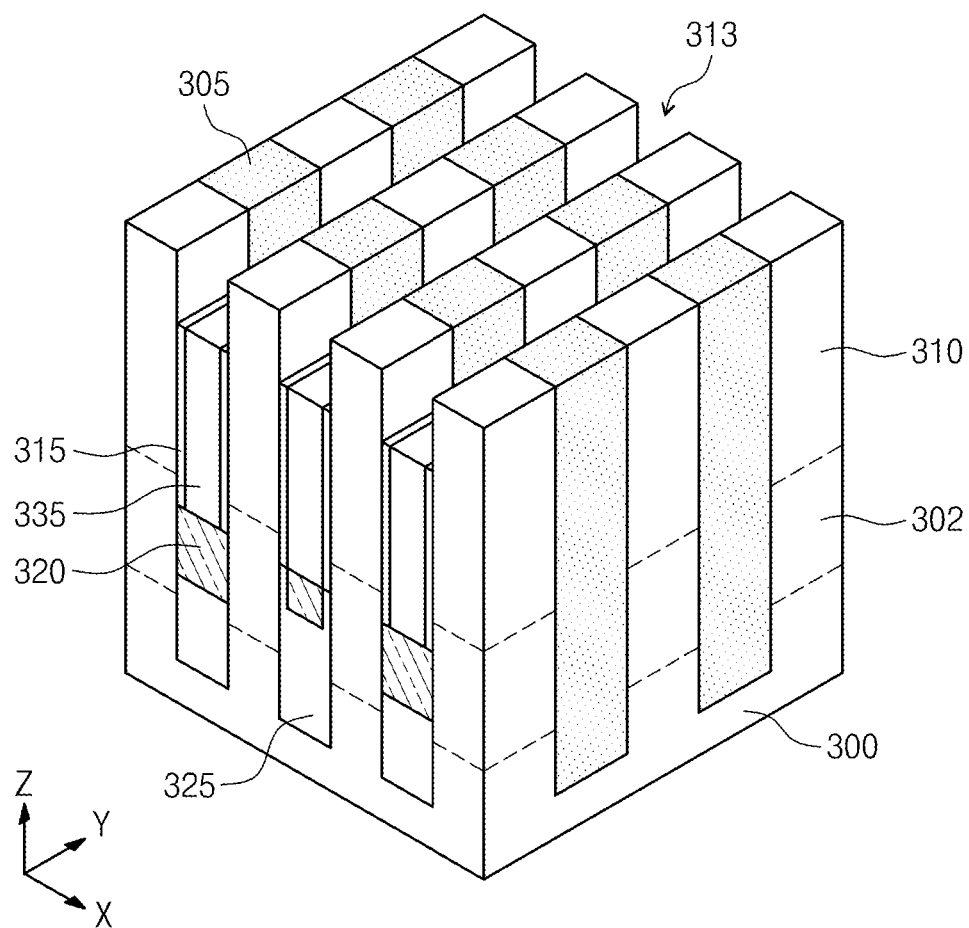
FIGS. 6A to 6D are perspective views illustrating a method of fabricating the semiconductor device of FIG. 3A, according to the inventive concept.

Referring to FIG. 6A, a plurality of active pillars 310 are formed by forming a device isolation layer 305 having sections each extending in an X-direction and second trenches 313 each extending in a Y-direction on a semiconductor substrate 300 through processes which are similar to those illustrated in and described with reference to FIGS. 4A to 4K. Next, lower junctions 302 may be formed at lower parts of the active pillar 310s. Subsequently, bit lines 320 extending in the Y-direction are formed, and then a first capping insulating layer 335 is formed over the bit line 320. A sidewall insulating layer 315 is then formed along the sides of the second trenches 313 by deposition and etch back processes. The first capping insulating layer 335 sidewall insulating layer 315 may be etched back together with the deposited insulating material when forming the sidewall insulating layer 315.

Figure 6B:
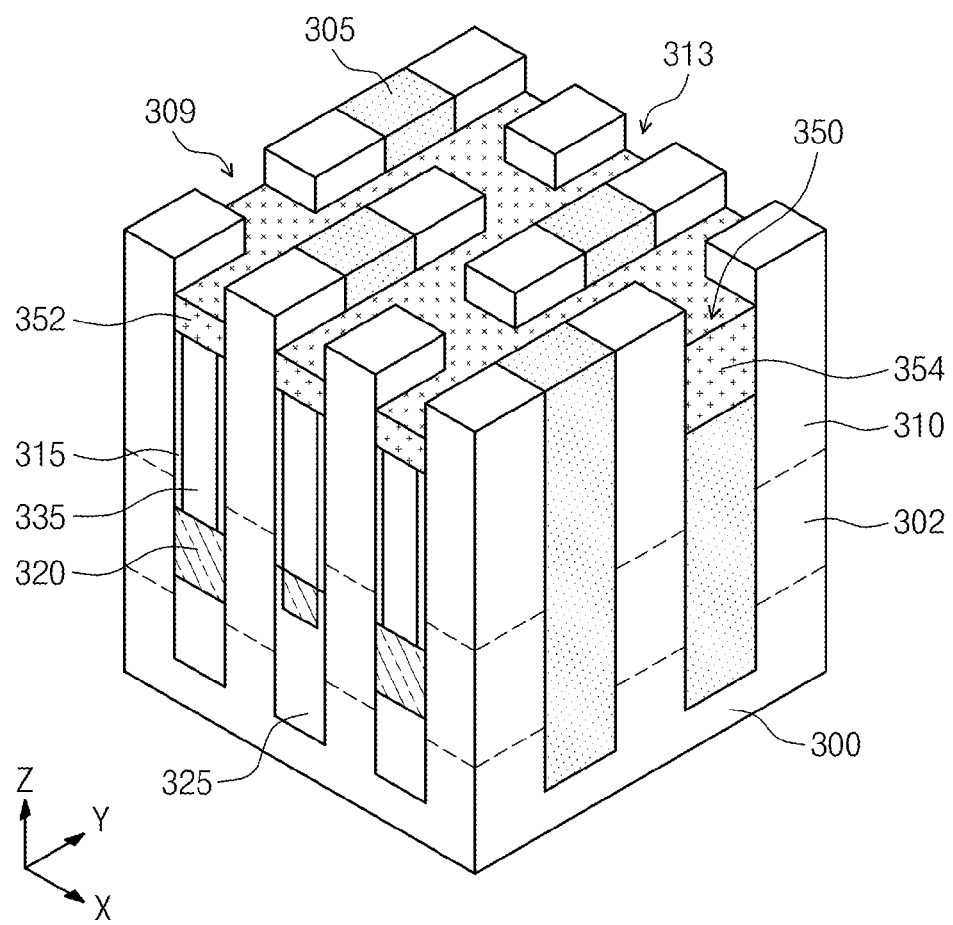

Referring to FIG. 6B, first holes 309 are formed in parts of the device isolation layer 305 by processes which are similar to those illustrated in and described with reference to FIG. 4K. In this embodiment, the first holes 309 are shallow so as to only expose upper parts of the active pillars 310. It is thus relatively easy to carry out the etching process for forming the first holes 309. Subsequently, a body contact line 350, which includes body contacts 354 filling the first holes 309 and an extension line 352 filling the second trenches 313, is formed.

Figure 6C:
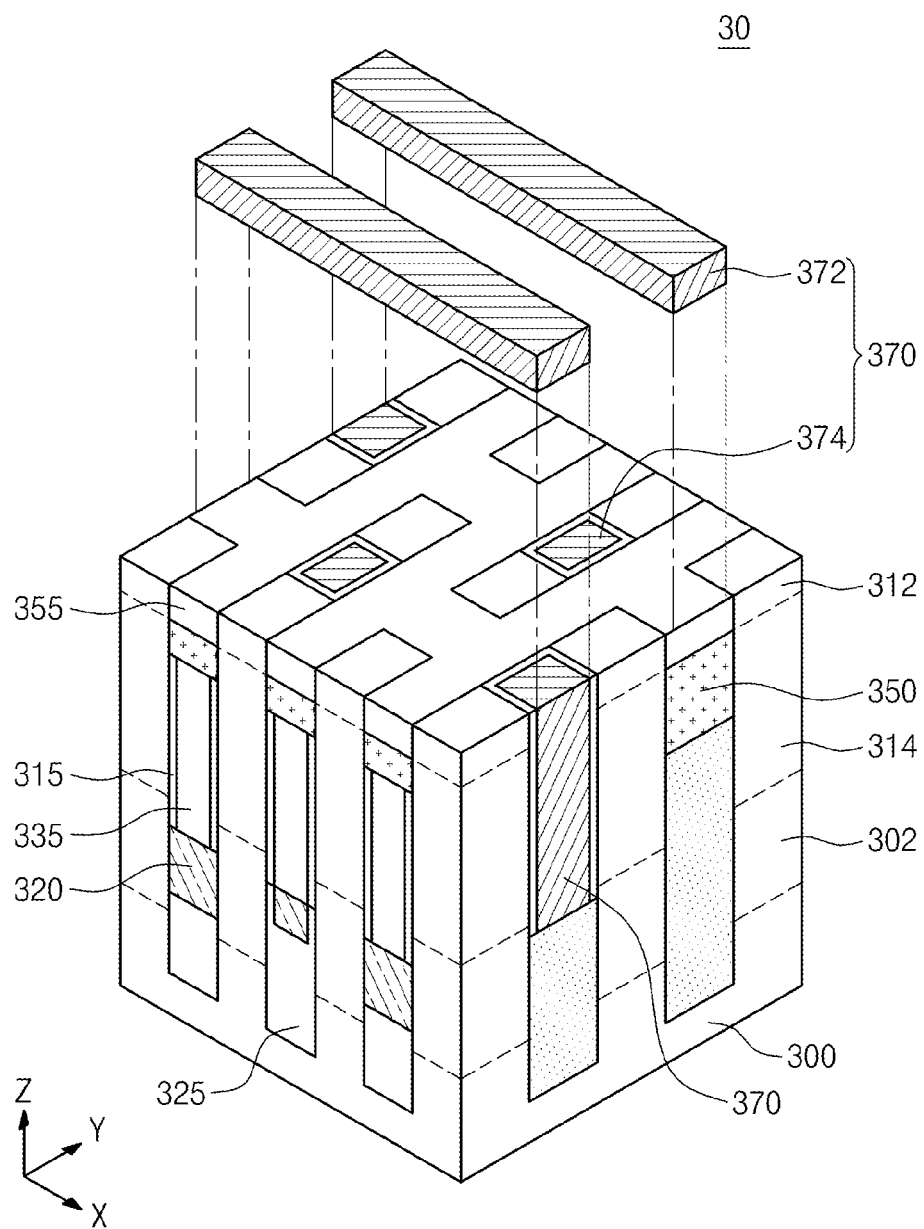

Referring to FIG. 6C, a vertical channel transistor 30 is completed by then forming a second capping insulating layer 355, upper junctions 312, and word lines 370 by processes which are similar to those illustrated in and described with reference to FIGS. 4M to 4O. In this embodiment, the body contact line 350 is formed in contact with the vertical channels 314 as illustrated in FIG. 3A.

Figure 6D:
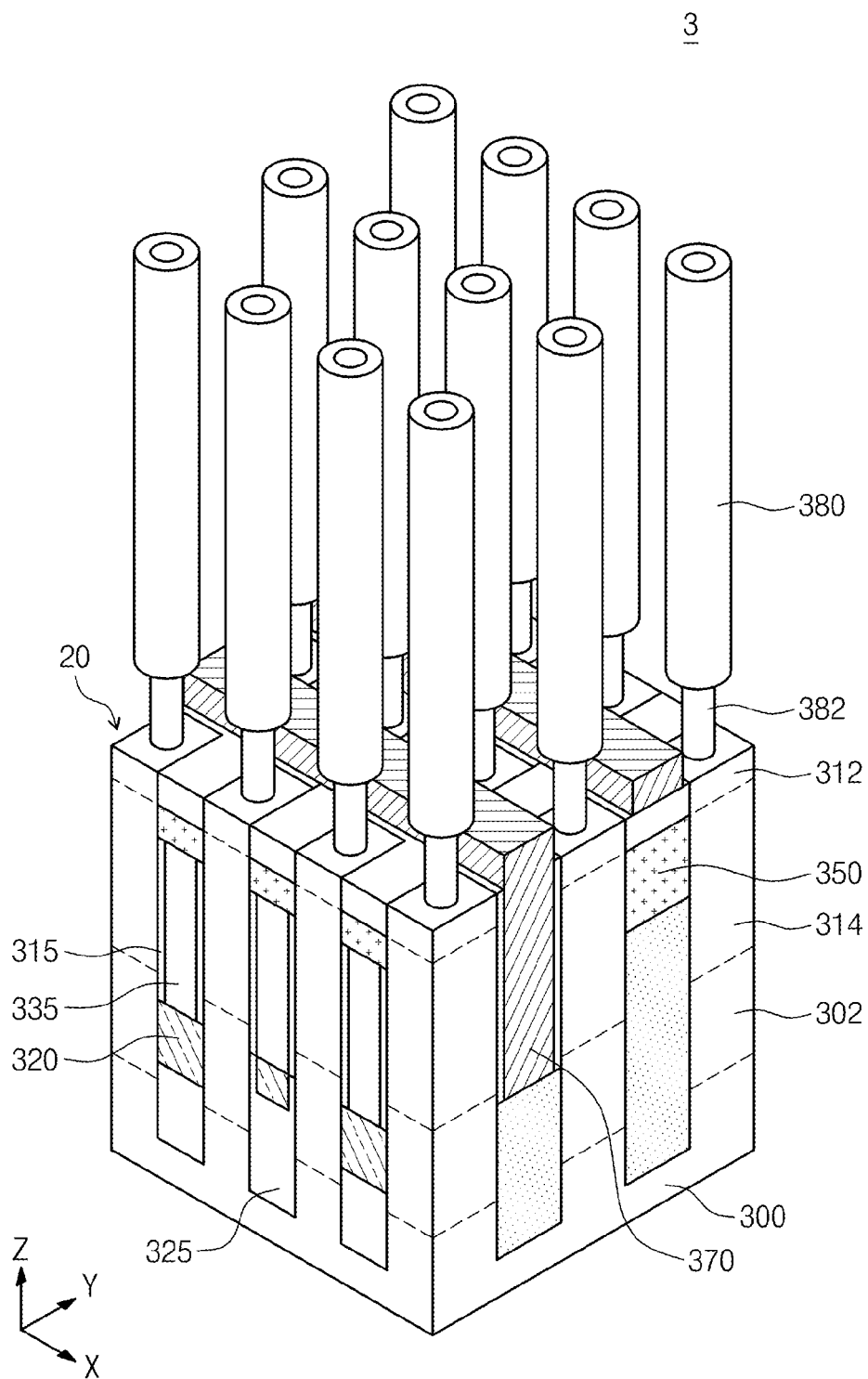

Referring to FIG. 6D, a semiconductor device 3 such as a DRAM may be completed by forming capacitors 380 which are electrically connected to the vertical channel transistor 30. Again, this step may be preceded by the forming of contact plugs 382 as a means to electrically connect the capacitors 380 to the vertical channel transistor 30.

Figure 7A:
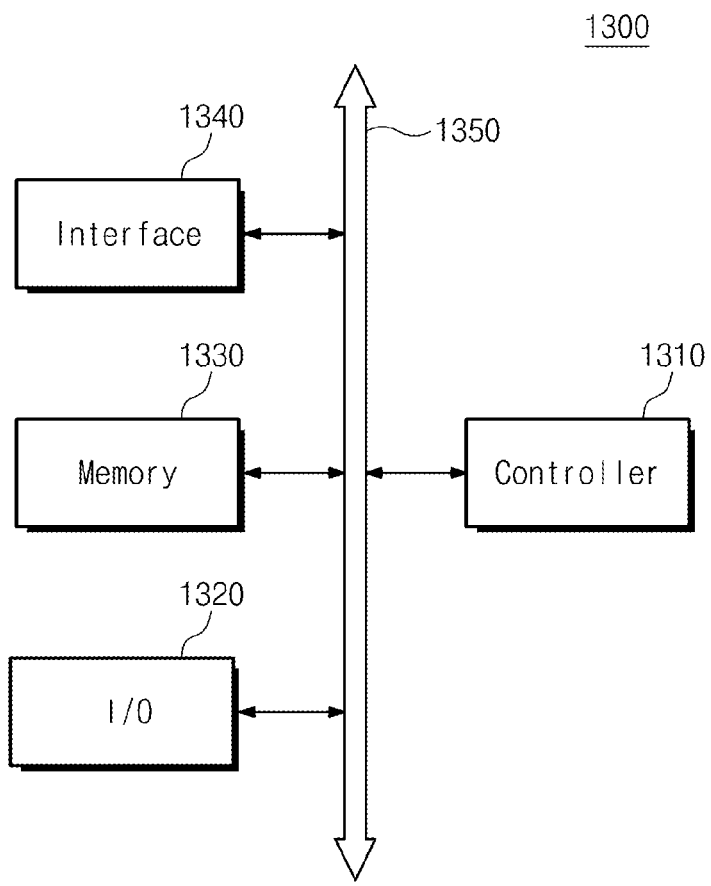
FIG. 7A is block diagram of an example of an electronic device having a semiconductor device according to the inventive concept.
Figure 7B:
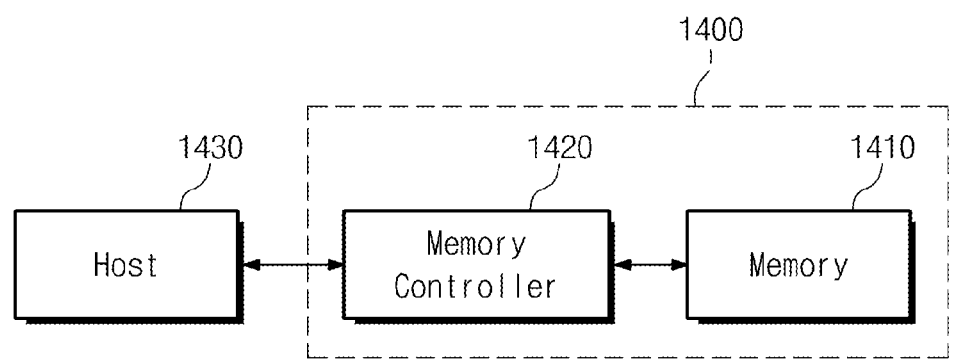
FIG. 7B is block diagram of an example of a memory system having a semiconductor device according to the inventive concept.

FIGS. 7A and 7B are block diagrams illustrating applications of a semiconductor device according to the inventive concept.

FIG. 7A illustrates an electronic device 1300 including a semiconductor device according to the inventive concept, of a type that may be employed by wireless communication devices, e.g., personal digital assistants, laptop computers, portable computers, web tablets, wireless phones, cell phones, MP3 players, or practically any other device capable of transmitting and/or receiving information in a wireless environment. In this example, the electronic device 1300 includes a controller 1310, an input/output device 1320 such as a keypad, keyboard and a display, a memory 1330, and a wireless interface 1340 connected to one another by a bus 1350. The controller 1310, for example, may include one or more microprocessors, digital signal processors, a microcontroller, or the like. The memory 1330 may be used for storing a command executed by the controller 1310 or for storing user data. The memory 1330 is the component that comprises a semiconductor device according to the inventive concept, in this example.

The wireless interface 1340 is used for transferring data to or receiving data (in the form of Radio Frequency (RF) signals) from a wireless communication network. To this end, the wireless interface 1340 may include an antenna and a wireless transceiver. Also, the electronic device 1300 may operate based on various communication protocols such as a 3rd generation wireless communications, e.g., CDMA, GSM, NADC, E-TDMA, WCDMA, and CDMA2000.

FIG. 7B illustrates an example of a memory system 1400 including a semiconductor device according to the inventive concept. The memory system 1400 includes a memory 1410 for storing data and a memory controller 1420. The memory controller 1420 controls the memory device 1410 for reading out data stored in the memory 1410 or writing data in response to a read/write request of a host 1430, e.g., a mobile device or a computer system. The memory controller 1420 may be configured with an address mapping table for corellating an address provided by the host 1430 with a physical address of the memory 1410. The memory 1410 includes a semiconductor device according to the inventive concept.

As was described above, according to the inventive concept, a back-gate or a body contact directly connected to a vertical channel is provided in addition to a gate in an NMOS-FET (or PMOSFET). Therefore, a path to the semiconductor substrate is provided for holes accumulated in the vertical channel. Accordingly, the floating body effect can be mitigated and thus, the transistor and associated device have excellent electrical characteristics.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device, comprising:
a plurality of active pillars disposed upright on a base so as to each have first and second opposite sides, and each of the active pillars having an upper junction at an upper part thereof, a lower junction at a lower part thereof, and a vertical channel located between the upper and lower junctions;
a plurality of gates facing the first sides of the vertical channels of the active pillars, respectively, wherein each of the gates, and the vertical channel and the junctions of the active pillar faced by the gate constitutes a field effect transistor;
conductive lines extending longitudinally from the gates, respectively, in a first direction, wherein each of the gates and the conductive line extending therefrom constitute a word line;
a plurality of bit lines extending longitudinally in a second direction crossing the first direction; and
a conductor comprising a plurality of conductive elements facing the second sides of the active pillars, respectively, and an extension line connecting the conductive elements, wherein each of the active pillars is interposed between one of the conductive elements and one of the gates,
wherein each gate is spaced apart from the first side of an active pillar, each conductive element is a back-gate spaced apart from the second side of the active pillar, and the back-gate spans the vertical channel and only the lower one of said lower and upper junctions and such that the back-gate and the lower junction constitute a second field effect transistor.

2. The semiconductor device of claim 1, further comprising an insulating layer interposed between the conductive lines and the second sides of the active pillars.

3. The semiconductor device of claim 2, wherein the conductor also faces all of the sides of the active pillars except the first sides.

4. The semiconductor device of claim 1, wherein one of the field effect transistors comprises an N-type Metal Oxide Semiconductor Field Effect Transistor (NMOSFET), and the other of the field effect transistors comprises a P-type Metal Oxide Semiconductor Field Effect Transistor (PMOSFET).

5. The semiconductor device of claim 1, wherein the base and the vertical channels are of a first conductivity type, the upper and lower junctions are of a second conductivity type, and each back-gate inverts a portion of the lower junction of an active pillar to form a channel of the first conductivity type between the vertical channel of the active pillar and the base.

6. The semiconductor device of claim 1, wherein the conductor comprises electrical contacts contacting the vertical channels, respectively.

7. The semiconductor device of claim 1, wherein the bit lines are located at a level in the device between the base and the level occupied by the word lines, the bit lines extend among the active pillars, and each of the bit lines has a width that varies.

8. The semiconductor device of claim 7, wherein each of the bit lines has an extension part, and an expansion part that is wider than the extension part, and the expansion part faces the lower junction of the active pillar.

9. A semiconductor device, comprising:
a substrate comprising a base, and an active pillar extending upright on the base so as to have first and second opposite sides, upper and lower regions of the active pillar being of one conductivity type, and a region of the active pillar in between the upper and lower regions being of the other conductivity type so as to constitute a vertical channel;
a gate disposed adjacent the first side of the active pillar and facing the vertical channel;
a conductive element facing the second side of the active pillar opposite the first side, and
wherein the vertical channel of the active pillar is interposed between the conductive element and the gate, and
the conductive element faces the vertical channel and the lower junction and terminates beneath the upper junction so as to not face the upper junction;
a dielectric layer interposed between the conductive element and the active pillar; and
a conductive line extending from an upper portion of the conductive element, and facing all of the sides of the active pillar except the first side.

10. The semiconductor device of claim 9, wherein the bottom of the conductive line is located adjacent the lower region of the active pillar.

11. The semiconductor device of claim 9, wherein the conductive element is an electrical contact that contacts the vertical channel.

12. The semiconductor device of claim 9, further comprising a passive electronic component electrically connected to the active pillar at the upper region of the active pillar.

* * * * *